United States Patent
Wachtel et al.

(10) Patent No.: US 9,640,914 B2
(45) Date of Patent: May 2, 2017

(54) CONNECTORS AND SYSTEMS HAVING IMPROVED CROSSTALK PERFORMANCE

(71) Applicant: Panduit Corp., Tinley Park, IL (US)

(72) Inventors: Paul W. Wachtel, Arlington Heights, IL (US); Masud Bolouri-Saransar, Orland Park, IL (US); Frank M. Straka, Orland Park, IL (US); Andrew Ciezak, Mokena, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 15/011,865

(22) Filed: Feb. 1, 2016

(65) Prior Publication Data

US 2016/0149344 A1    May 26, 2016

Related U.S. Application Data

(63) Continuation of application No. 14/208,342, filed on Mar. 13, 2014, now Pat. No. 9,257,792.

(60) Provisional application No. 61/781,641, filed on Mar. 14, 2013, provisional application No. 61/794,541, filed on Mar. 15, 2013, provisional application No. 61/784,290, filed on Mar. 14, 2013.

(51) Int. Cl.
| | | |
|---|---|---|
| H01R 24/00 | (2011.01) | |
| H01R 13/6464 | (2011.01) | |
| H01R 13/6461 | (2011.01) | |
| H01R 13/6466 | (2011.01) | |
| H01R 24/64 | (2011.01) | |
| H05K 1/02 | (2006.01) | |
| H01R 13/719 | (2011.01) | |

(52) U.S. Cl.
CPC ..... *H01R 13/6464* (2013.01); *H01R 13/6461* (2013.01); *H01R 13/6466* (2013.01); *H01R 13/719* (2013.01); *H01R 24/64* (2013.01); *H05K 1/0228* (2013.01)

(58) Field of Classification Search
CPC .......................... H01R 23/025; H01R 23/005
USPC .................................................. 439/676, 941
See application file for complete search history.

(56) References Cited

U.S. PATENT DOCUMENTS

| | | | |
|---|---|---|---|
| 5,295,869 A | 3/1994 | Siemon et al. | |
| 5,299,956 A | 4/1994 | Brownell et al. | |
| 5,310,363 A | 5/1994 | Brownell et al. | |
| 5,362,257 A | 11/1994 | Neal et al. | |
| 5,432,484 A | 7/1995 | Klas et al. | |
| 5,459,643 A | 10/1995 | Siemon et al. | |

(Continued)

FOREIGN PATENT DOCUMENTS

WO    2010065588 A1    6/2010

*Primary Examiner* — Hae Moon Hyeon
(74) *Attorney, Agent, or Firm* — Christopher S. Clancy; James H. Williams; Yuri Astvatsaturov

(57) ABSTRACT

Embodiments of the present invention generally relate to the field of electronic communication, and more particularly, to techniques used to compensate for/reduce/or otherwise manipulate crosstalk in communication connectors, and apparatuses and methods which employ such techniques. In an embodiment, the present invention is a communication connector that includes a plurality of signal pairs including at least a first pair and a second pair, a first compensation stage between the first pair and the second pair, and an orthogonal compensation network between the first pair and the second pair. The orthogonal compensation network can be time delayed from the first compensation stage.

12 Claims, 27 Drawing Sheets

(56) References Cited

U.S. PATENT DOCUMENTS

| | | |
|---|---|---|
| 5,470,244 A | 11/1995 | Lim et al. |
| 5,474,474 A | 12/1995 | Siemon et al. |
| 5,547,405 A | 8/1996 | Pinney et al. |
| 5,586,914 A | 12/1996 | Foster, Jr. et al. |
| 5,626,497 A | 5/1997 | Bouchan et al. |
| 5,673,009 A | 9/1997 | Klas et al. |
| 5,700,167 A | 12/1997 | Pharney et al. |
| 5,791,943 A | 8/1998 | Lo et al. |
| 5,938,479 A | 8/1999 | Paulson et al. |
| 5,997,358 A | 12/1999 | Adriaenssens et al. |
| 6,023,200 A | 2/2000 | Rhee |
| 6,089,923 A | 7/2000 | Phommachanh |
| 6,099,357 A | 8/2000 | Reichle |
| 6,168,474 B1 | 1/2001 | German et al. |
| 6,176,742 B1 | 1/2001 | Arnett et al. |
| 6,186,834 B1 | 2/2001 | Arnett et al. |
| 6,196,880 B1 | 3/2001 | Goodrich et al. |
| 6,231,397 B1 | 5/2001 | De La Borbolla et al. |
| 6,270,381 B1 | 8/2001 | Adriaenssens et al. |
| 6,283,795 B1 | 9/2001 | Chen |
| 6,356,162 B1 | 3/2002 | DeFlandre et al. |
| 6,379,157 B1 | 4/2002 | Curry et al. |
| 6,435,918 B1 | 8/2002 | Chen |
| 6,443,776 B2 | 9/2002 | Reichle |
| 6,464,529 B1 | 10/2002 | Jensen et al. |
| 6,464,541 B1 | 10/2002 | Hashim et al. |
| 6,533,618 B1 | 3/2003 | Aekins |
| 6,612,880 B2 | 9/2003 | Arnett et al. |
| 6,866,548 B2 | 3/2005 | Hashim |
| 6,916,209 B1 | 7/2005 | Casher et al. |
| 6,964,587 B2 | 11/2005 | Colantuono et al. |
| 7,038,554 B2 | 5/2006 | Seefried |
| 7,048,590 B2 | 5/2006 | Colantuono et al. |
| 7,052,328 B2 | 5/2006 | Ciezak et al. |
| 7,057,899 B2 | 6/2006 | AbuGhazaleh et al. |
| 7,086,909 B2 | 8/2006 | Colantuono et al. |
| 7,140,924 B2 | 11/2006 | Redfield et al. |
| 7,153,168 B2 | 12/2006 | Caveney et al. |
| 7,154,049 B2 | 12/2006 | Celella et al. |
| 7,166,000 B2 | 1/2007 | Pharney |
| 7,168,993 B2 | 1/2007 | Hashim |
| 7,175,476 B2 | 2/2007 | Kim et al. |
| 7,176,383 B2 | 2/2007 | Lauffer et al. |
| 7,179,131 B2 | 2/2007 | Caveney et al. |
| 7,182,649 B2 | 2/2007 | Caveney et al. |
| 7,190,594 B2 | 3/2007 | Hashim et al. |
| 7,201,618 B2 | 4/2007 | Ellis et al. |
| 7,204,722 B2 | 4/2007 | Hashim et al. |
| 7,252,554 B2 | 8/2007 | Caveney et al. |
| 7,265,300 B2 | 9/2007 | Adriaenssens et al. |
| 7,281,957 B2 | 10/2007 | Caveney |
| 7,294,025 B1 | 11/2007 | Chen |
| 7,301,780 B2 | 11/2007 | AbuGhazaleh et al. |
| 7,309,261 B2 | 12/2007 | Caveney et al. |
| 7,314,393 B2 | 1/2008 | Hashim |
| 7,320,624 B2 | 1/2008 | Hashim et al. |
| 7,364,470 B2 | 4/2008 | Hashim |
| 7,367,849 B2 | 5/2008 | Wang et al. |
| 7,381,098 B2 | 6/2008 | Hammond, Jr. et al. |
| 7,384,315 B2 | 6/2008 | Caveney et al. |
| 7,402,085 B2 | 7/2008 | Hammond, Jr. et al. |
| 7,427,218 B1 | 9/2008 | Hashim et al. |
| 7,442,092 B2 | 10/2008 | Caveney et al. |
| 7,452,246 B2 | 11/2008 | Caveney et al. |
| 7,481,681 B2 | 1/2009 | Caveney et al. |
| 7,485,010 B2 | 2/2009 | Aekins |
| 7,500,883 B2 | 3/2009 | Ciezak et al. |
| 7,520,784 B2 | 4/2009 | Caveney et al. |
| 7,537,484 B2 * | 5/2009 | Reeves ............... H01R 13/719 439/620.11 |
| 7,591,686 B2 | 9/2009 | Ellis et al. |
| 7,591,689 B2 | 9/2009 | Caveney et al. |
| 7,618,296 B2 | 11/2009 | Caveney |
| 7,677,930 B2 | 3/2010 | Hashim et al. |
| 7,677,931 B2 | 3/2010 | Aekins |
| 7,682,203 B1 | 3/2010 | Pharney et al. |
| 7,686,650 B2 | 3/2010 | Belopolsky et al. |
| 7,726,018 B2 | 6/2010 | Caveney et al. |
| 7,787,615 B2 | 8/2010 | Hammond, Jr. et al. |
| 7,823,281 B2 | 11/2010 | Caveney et al. |
| 7,824,231 B2 | 11/2010 | Marti et al. |
| 7,841,909 B2 | 11/2010 | Murray et al. |
| 7,850,492 B1 | 12/2010 | Straka et al. |
| 7,854,632 B2 | 12/2010 | Reeves et al. |
| 7,874,878 B2 | 1/2011 | Fite et al. |
| 7,874,879 B2 | 1/2011 | Caveney et al. |
| 7,892,040 B2 | 2/2011 | Ellis et al. |
| 7,909,656 B1 | 3/2011 | Erickson et al. |
| 7,914,345 B2 | 3/2011 | Bopp et al. |
| 7,914,346 B2 | 3/2011 | Pharney et al. |
| 7,927,153 B2 | 4/2011 | Straka et al. |
| 7,955,139 B2 | 6/2011 | Straka et al. |
| 7,967,645 B2 | 6/2011 | Marti et al. |
| 7,976,348 B2 | 7/2011 | Aekins et al. |
| 7,976,349 B2 | 7/2011 | Heckmann |
| 7,980,900 B2 | 7/2011 | Hashim et al. |
| 7,985,103 B2 | 7/2011 | Straka et al. |
| 8,002,571 B2 | 8/2011 | Hogue et al. |
| 8,007,311 B2 | 8/2011 | Hogue et al. |
| 8,011,972 B2 | 9/2011 | Caveney et al. |
| 8,016,621 B2 | 9/2011 | Bopp et al. |
| 8,038,482 B2 | 10/2011 | Erickson et al. |
| 8,047,879 B2 | 11/2011 | Hashim |
| 8,052,483 B1 | 11/2011 | Straka et al. |
| 8,128,437 B2 | 3/2012 | Straka et al. |
| 8,403,709 B2 | 3/2013 | Hammond, Jr. et al. |
| 9,136,647 B2 * | 9/2015 | Straka ............... H01R 13/6466 |
| 9,246,463 B2 | 1/2016 | Devine et al. |
| 9,257,792 B2 * | 2/2016 | Wachtel ............ H01R 13/6461 |
| 2005/0239340 A1 | 10/2005 | Jackson |
| 2005/0254223 A1 | 11/2005 | Hashim et al. |
| 2007/0238366 A1 | 10/2007 | Hammond, Jr. et al. |
| 2010/0048040 A1 | 2/2010 | Straka et al. |
| 2010/0167589 A1 | 7/2010 | Hammond, Jr. et al. |
| 2010/0317230 A1 | 12/2010 | Larsen et al. |
| 2011/0086549 A1 | 4/2011 | Caveney et al. |
| 2011/0122767 A1 | 5/2011 | Dent |
| 2011/0318970 A1 | 12/2011 | Hammond, Jr. et al. |
| 2012/0003874 A1 | 1/2012 | Reeves et al. |
| 2012/0100744 A1 | 4/2012 | Bolouri-Saransar et al. |
| 2013/0130560 A1 | 5/2013 | Bolouri-Saransar et al. |
| 2014/0127943 A1 * | 5/2014 | Liang ............... H01R 13/6464 439/620.23 |

* cited by examiner

10 MHz

2000 MHz

CONNECTORS AND SYSTEMS HAVING IMPROVED CROSSTALK PERFORMANCE

CROSS-REFERENCE TO RELATED APPLICATIONS

This application is a continuation of U.S. patent application Ser. No. 14/208,342 filed Mar. 13, 2014; which claims the benefit of U.S. Provisional Patent Application No. 61/784,290 filed Mar. 14, 2013; U.S. Provisional Patent Application No. 61/781,641 filed Mar. 14, 2013; and U.S. Provisional Patent Application No. 61/794,541 filed Mar. 15, 2013, all of which are incorporated herein by reference in their entirety.

FIELD OF INVENTION

Embodiments of the present invention generally relate to the field of electronic communication, and more particularly, to techniques used to compensate for/reduce/or otherwise manipulate crosstalk in communication connectors, and apparatuses and methods which employ such techniques.

BACKGROUND

The continued evolution of communication networks must often overcome the basic challenges of advancing technical solutions while at the same time taking into consideration the past and present communication infrastructure. An example of this may be seen in the 40 Gigabit Ethernet over twisted pair cabling (40 GBASE-T), which is a potentially new Ethernet standard that will require cabling and connectivity to have a bandwidth of approximately 2 GHz. At this point in time there are no officially published standards concerning this technology. However, today's extensive use of RJ45 connectivity in communication networks can mean that there will be a desire or a need to implement 40 GBASE-T over networks which would be compatible with the RJ45 standard in at least some cases.

One of the key technical challenges is designing a connectivity solution that sufficiently minimizes the near end crosstalk (NEXT) between wire-pairs across the usable 2 GHz bandwidth. The 4:5-3:6 wire-pair combination is particularly challenging as the NEXT present in an RJ45 plug is the highest due to the 3:6 wire-pair splitting around and straddling the 4:5 wire-pair. FIG. 1 illustrates the NEXT performance of an RJ45 plug for pair combination 4:5-3:6 up to 2 GHz. Marker 1 identifies the NEXT at 100 MHz to be −38.1 dB which is about equal to the low plug requirement for a Category 6A RJ45 plug. Marker 2 identifies the NEXT at 100 MHz to be −39.5 dB which is about equal to the high plug requirement for a Category 6A RJ45 plug. The majority of jacks which implement known two-stage compensation techniques are usually tuned to optimize NEXT performance up to 500 MHz when those jacks are mated to an RJ45 plug which is within the low and high plug limits show in FIG. 1. However, the inherent time delay between the crosstalk originating within the plug and the compensation network within the jack can pose a limitation to extending the optimized NEXT performance of the jack beyond 500 MHz.

The time delay is a result of the physical distance between the plug and the compensation arrangement within the jack. If, for example, a time delay of 25 ps (picoseconds) between the plug crosstalk and the jack's compensation is assumed, the simulated NEXT performance of the 4:5-3:6 wire-pair combination will fail a proposed NEXT specifications, as shown in FIG. 2, for the high plug conditions over at least some of the frequency range (the high plug performance of the plug/jack connector combination come near, and in some cases above, a specified maximum NEXT at or above 500 MHz). Note that the exemplary time delay of 25 ps is relatively optimistic in terms of positioning the compensation from the plug crosstalk. However, if the time delay is decreased to a value below 25 ps, the plug/jack system performance would still come close to the specified maximum, leaving the possibility of the plug/jack combination NEXT exceeding the that maximum due to manufacturing tolerances. The exemplary proposed NEXT specification is an extension of the Category 6A component NEXT requirement up to 2 GHz as detailed in Table 1 below.

TABLE 1

| Frequency (MHz) | 4:5-3:6 NEXT Loss (dB) |
|---|---|
| 1 ≤ f ≤ 250 | 52.5−20log(f/100) |
| 250 ≤ f ≤ 500 | 44.54−20log(f/250) |
| 500 ≤ f ≤ 1000 | 35.5−20log(f/500) |

The limitation recited in Table 1 highlight the need for improved connectivity capable of operating above 500 MHz and being compatible with the RJ45 standard in at least some cases.

Note that while the proposed NEXT specification is described as an extension of the Category 6A component NEXT requirement up to 2 GHz, this discussion should be interpreted as non-limiting as this is not the only potential NEXT specification contemplated by the current specification. Principles disclosed in this specification and embodied by the present invention may be applied to any potential NEXT requirements as set forth by any standards bodies now or in the future.

SUMMARY

Accordingly, embodiments of the present invention are directed to communication connectors and/or internal components thereof and methods of compensating for/reducing/manipulating crosstalk within communication connectors and systems.

In one embodiment the present invention is a communication connector that includes a plurality of signal pairs including at least a first pair and a second pair, a first compensation stage between the first pair and the second pair, and an orthogonal compensation network between the first pair and the second pair. The orthogonal compensation network can be time delayed from the first compensation stage.

In another embodiment the present invention is a communication system that includes communication equipment connected to a communication connector. The communication connector has a plurality of signal pairs including at least a first pair and a second pair, a first compensation stage between the first pair and the second pair, and an orthogonal compensation network between the first pair and the second pair. The orthogonal compensation network can be time delayed from the first compensation stage.

In yet another embodiment the present invention is a communication connector having a plurality of signal pairs including at least a first pair and a second pair, and a first resonant crosstalk circuit between the first pair and the second pair.

In yet another embodiment the present invention is a method of tuning a communication connector including the steps of providing a plurality of signal pairs; reducing a first crosstalk between pairs; and adding a second crosstalk between the same pairs.

These and other features, aspects, and advantages of the present invention will become better-understood with reference to the following drawings, description, and any claims that may follow.

DETAILED DESCRIPTION

Figure 1:
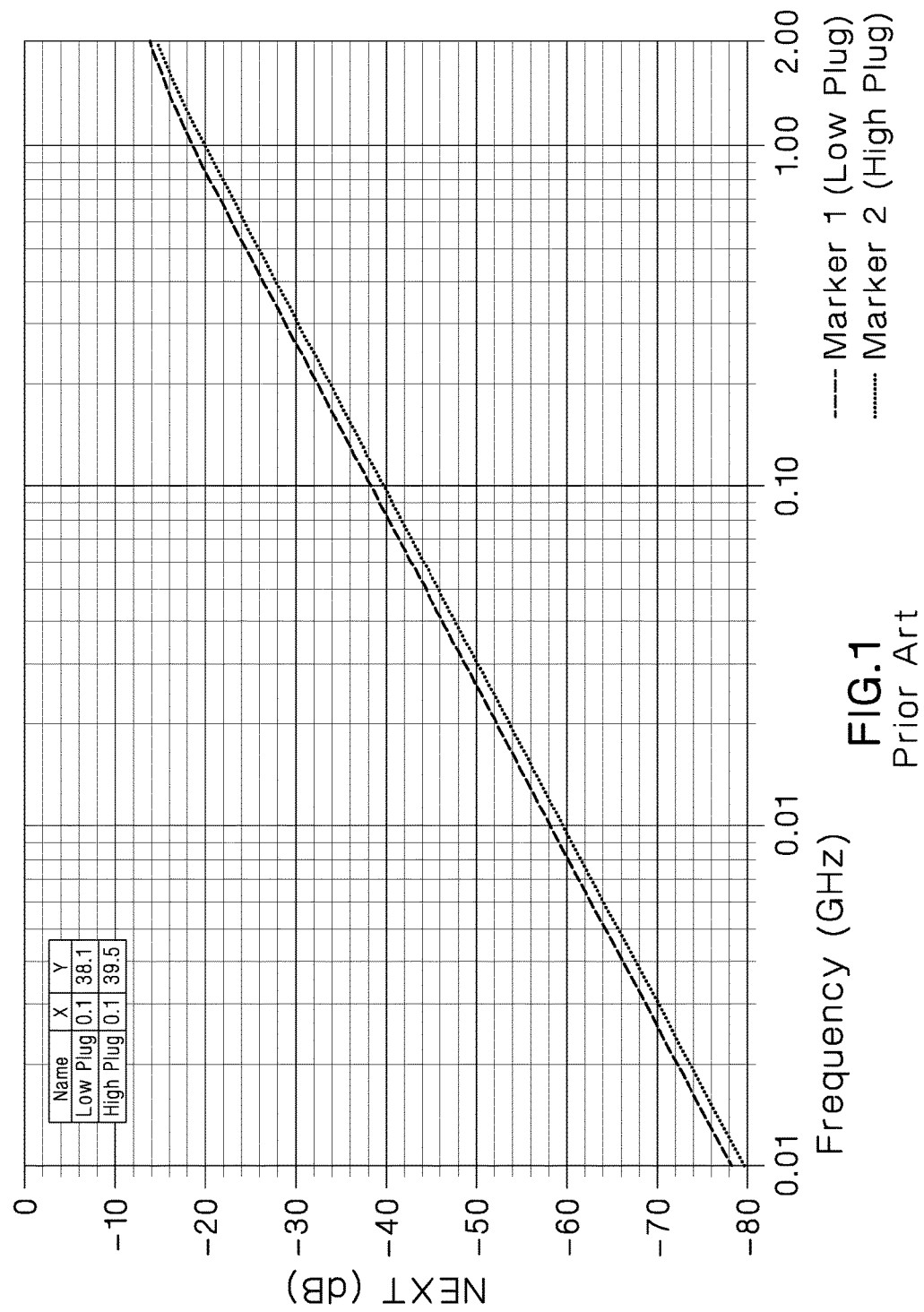
FIG. 1 illustrates NEXT on the 4:5-3:6 wire-pair combination for an RJ45 plug.
Figure 2:
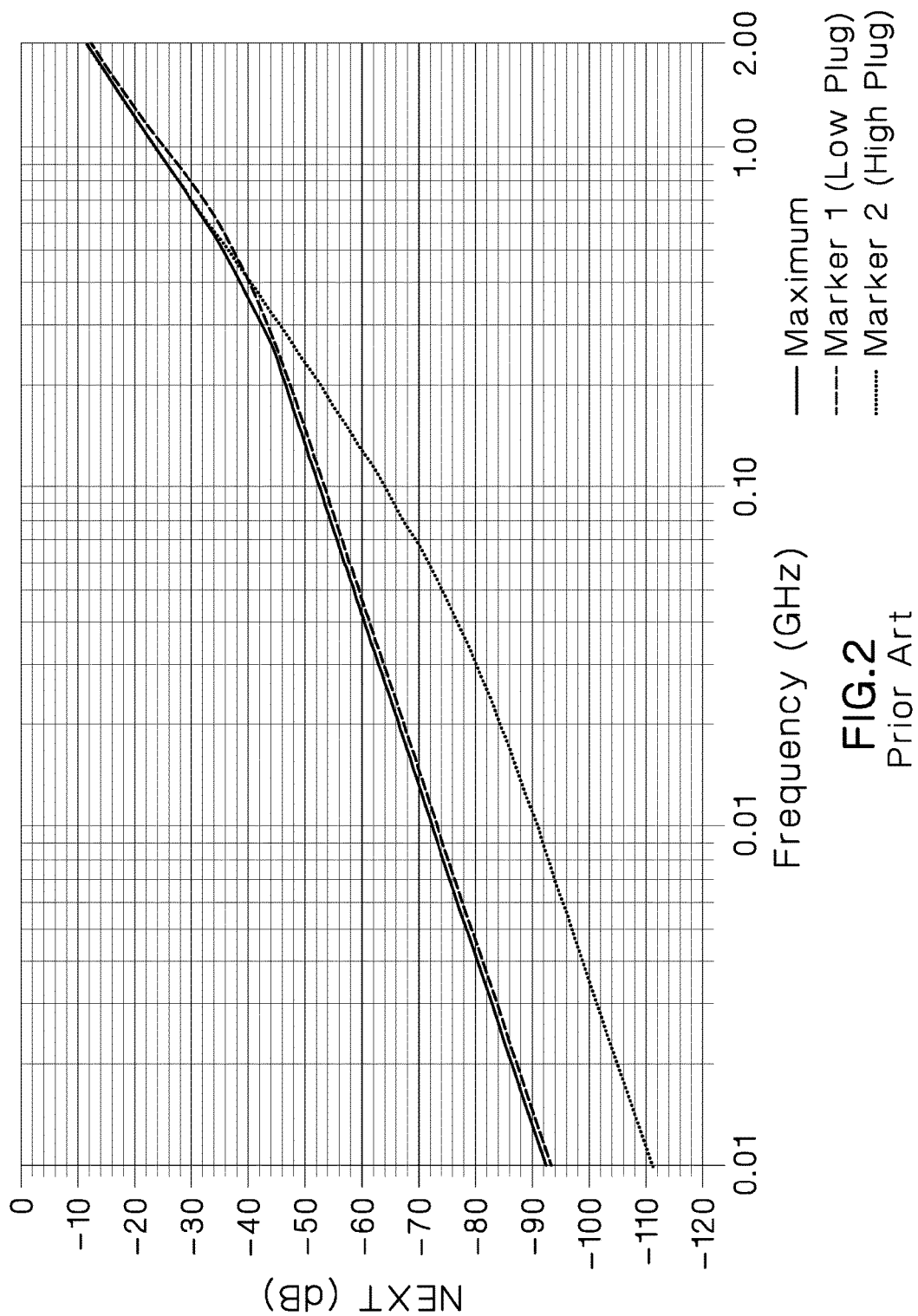
FIG. 2 illustrates NEXT on the 4:5-3:6 wire-pair combination for a mated RJ45 plug and jack using a traditional two-stage compensation technique.

As used herein, "opposite polarity" can be defined as being approximately 180 degrees out of phase in relation to a referenced polarity, and "orthogonal" can be defined as being approximately 90 degrees out of phase in relation to a referenced polarity. Also, as used herein, references to "shunting" can be defined as direct or indirect coupling of two conductors of the same differential pair via some means. For example, a shunting capacitive coupling on a wire pair (e.g., 3:6 wire pair) can refer to some form of a capacitive coupling (e.g., pad capacitor) positioned between a first conductor (e.g., conductor 3) and second conductor (e.g., conductor 6) of that wire pair. Note that indirect coupling may include intervening components such as offshoot traces. Furthermore, "conductor(s)," "signal conductor(s)," and "signal trace(s)" may be used interchangeably and shall be understood to refer to the same feature. Additionally, same reference numbers or designations may be used to reference like or similar (and non-identical) elements through various embodiments.

In RJ45 plug/jack connector combinations, NEXT generally occurs between the neighboring conductors of differential pairs. The source of NEXT in an RJ45 plug/jack connector combination is generally the plug. This NEXT in the plug is primarily caused by the manner in which the plug conductors are laid out in accordance with ANSI/TIA-568-C.2. The plug layout causes unbalanced coupling between conductor pairs which creates high levels of NEXT between conductor pairs 1:2 and 3:6, conductor pairs 3:6 and 4:5, and conductor pairs 3:6 and 7:8. This unbalanced coupling must be compensated for in the jack. In case of conductor pairs 1:2 and 3:6, plug NEXT can occur due to the coupling which can primarily exist between conductors 2 and 3; in case of conductor pairs 3:6 and 4:5, plug NEXT can occur due to the coupling which can primarily exist between conductors 3 and 4, and/or conductors 5 and 6; and in case of conductor pairs 3:6 and 7:8, plug NEXT can occur due to the coupling which can primarily exist between conductors 6 and 7.

Embodiments of the present invention employ multiple compensation stages in an attempt to sufficiently manage NEXT and potentially achieve bandwidth up to and/or past 2 GHz for wire-pair combination 4:5-3:6. While at least some of the embodiments are described with reference to conductor pairs 4:5 and 3:6 of an RJ45 plug/jack connector combination having plug contacts laid out in accordance with ANSI/TIA-568-C.2, it should be understood that the same principles of crosstalk compensation can be applied to other differential pairs of such a plug/jack combination (e.g., conductor pairs 3:6 and 1:2, and conductor pairs 3:6 and 7:8) or to other connectors which employ differential pair transmission.

Figure 3:
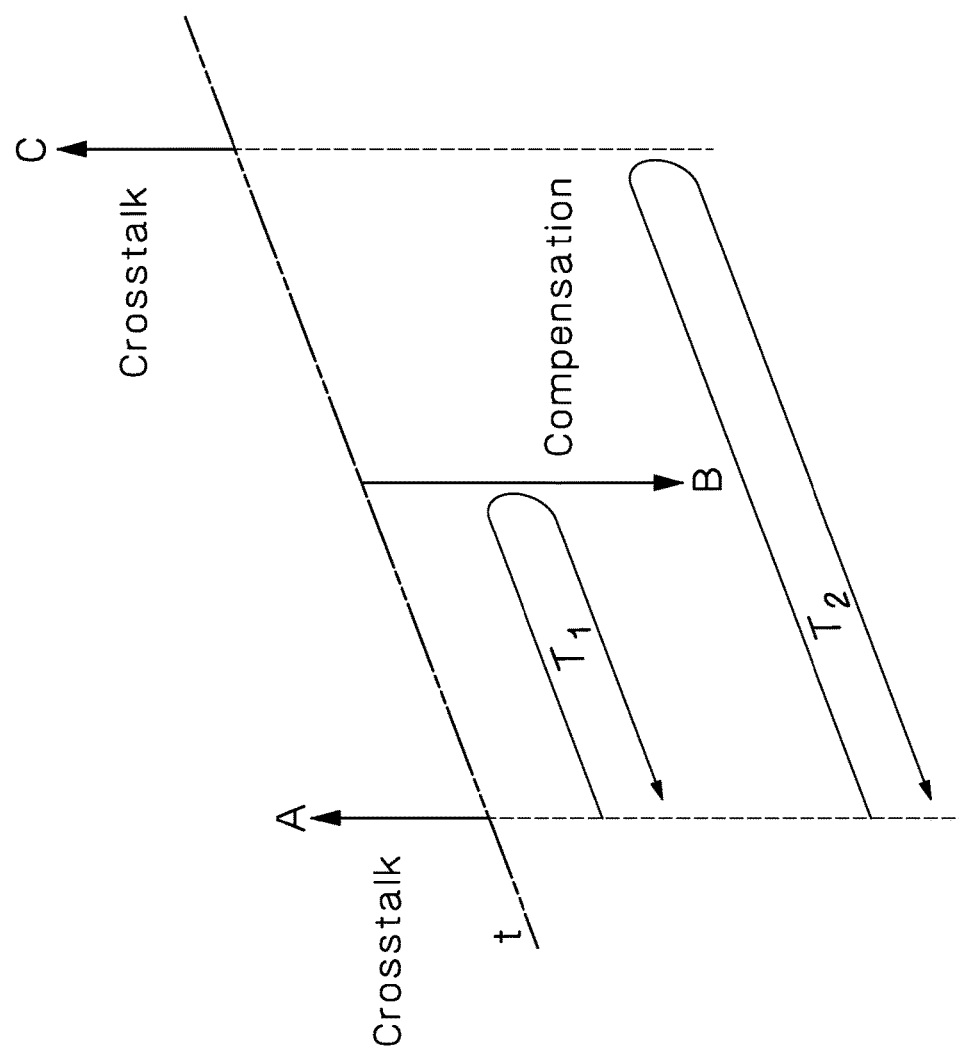
FIG. 3 illustrates a vector diagram for lumped approximation of the signals generated by a traditional two-stage compensation technique.

Referring now to FIG. 3, said figure illustrates a lumped approximation of signal magnitude and polarity for signals generated by a combination of a plug mated to a jack having a traditional two-stage compensation scheme implemented therein. The signals are represented by vectors A, B, and C on a time axis, with vector A representing the crosstalk generated within the plug, vector B representing the compensation signal provided by the first stage of the compensation network, and vector C representing the crosstalk signal provided by the second stage of the compensation network. In this traditional two-stage compensation network, the crosstalk-producing vector A is separated from the first and second stages of the compensation network by a time delay $T_1/2$ and $T_2/2$, respectively. Due to the resulting total round trip time of $T_1$ and $T_2$ for signals to traveling from the position of vector A to the first and second compensation stages, respectively, and then back to the position of vector A, the phase of vectors B and C rotate relative to the plug vector A as the operational frequency increases.

Figure 4:
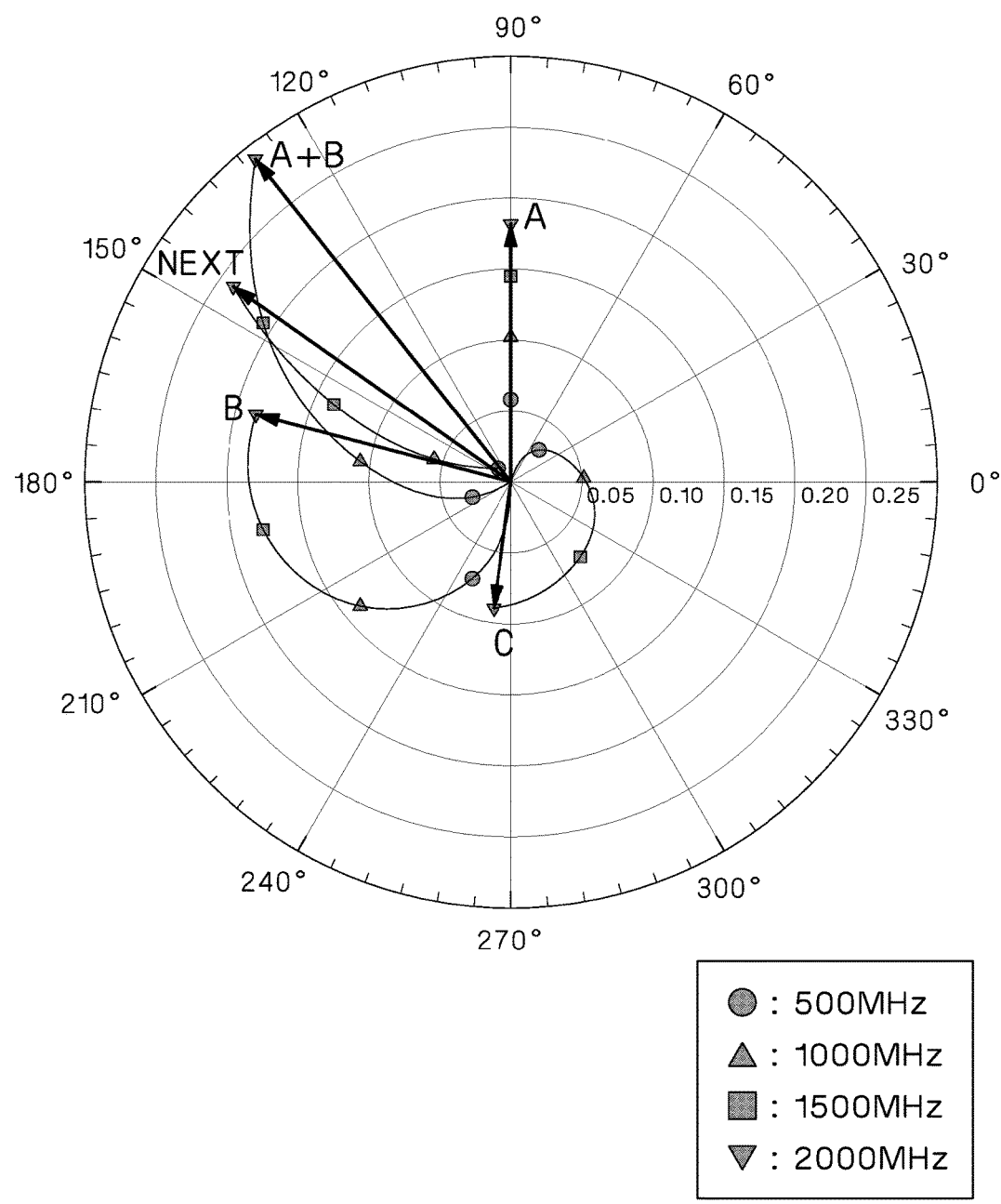
FIG. 4 illustrates a polar plot representative of the signals produced by the known two-stage technique of FIG. 3 over a frequency range.
Figure 5:
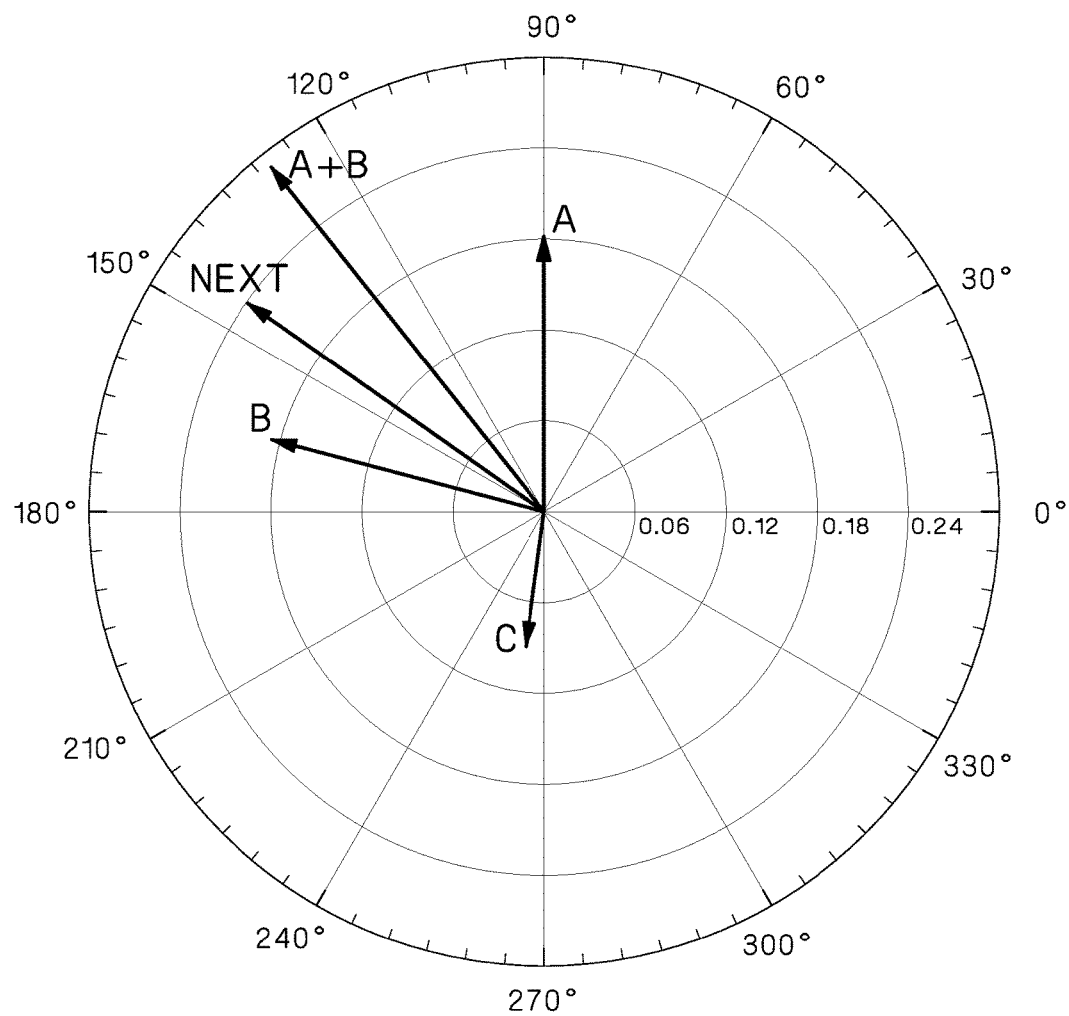
FIG. 5 illustrates a polar plot representative of the signals produced by the known two-stage technique of FIG. 3 at 2000 MHz.

FIG. 4 illustrates a polar plot representative of the change in magnitude and phase of the plug crosstalk vector and the compensation vectors of a traditional two-stage compensation network at operational frequencies of 500 MHz, 1000 MHz, 1500 MHz, and 2000 MHz. Note that vector A+B represents the net summation of individual vectors A and B. Furthermore, vector NEXT represents the net summation of individual vectors A, B, and C. Examination of the polar plot at 2000 MHz (see also FIG. 5) reveals that the resultant vector A+B has an approximately 132 degree phase shift and an approximately 10 dB increase in magnitude relative to vector C representing the second stage of compensation. Because the second stage signal (vector C) is not approximately 180 degrees out of phase with the resultant vector A+B and the magnitudes of these two vectors are not similar, the second stage does little to sufficiently minimize the overall crosstalk represented by vector NEXT above 500 MHz.

Another vector having an approximately 90 degree phase shift relative to the second stage crosstalk vector C at or below 500 MHz may potentially offset the final NEXT vector and improve overall performance at least at 2000 MHz. Accordingly, in one embodiment of the present invention, an orthogonal vector is incorporated into the second stage of compensation. The implementation of an orthogonal vector together with a compensation or a crosstalk signal (generally referred to as an orthogonal compensation network (OCN)) is further described in U.S. patent application Ser. No. 13/681,480, filed on Nov. 20, 2012, entitled "COMPENSATION NETWORK USING AN ORTHOGONAL COMPENSATION NETWORK," and also in U.S. patent application Ser. No. 14/198,291, filed on Mar. 5, 2013, entitled "COMPENSATION NETWORKS AND COMMUNICATION CONNECTORS USING SAID COMPENSATION NETWORKS," both of which are incorporated herein by reference in their entirety.

Figure 6:
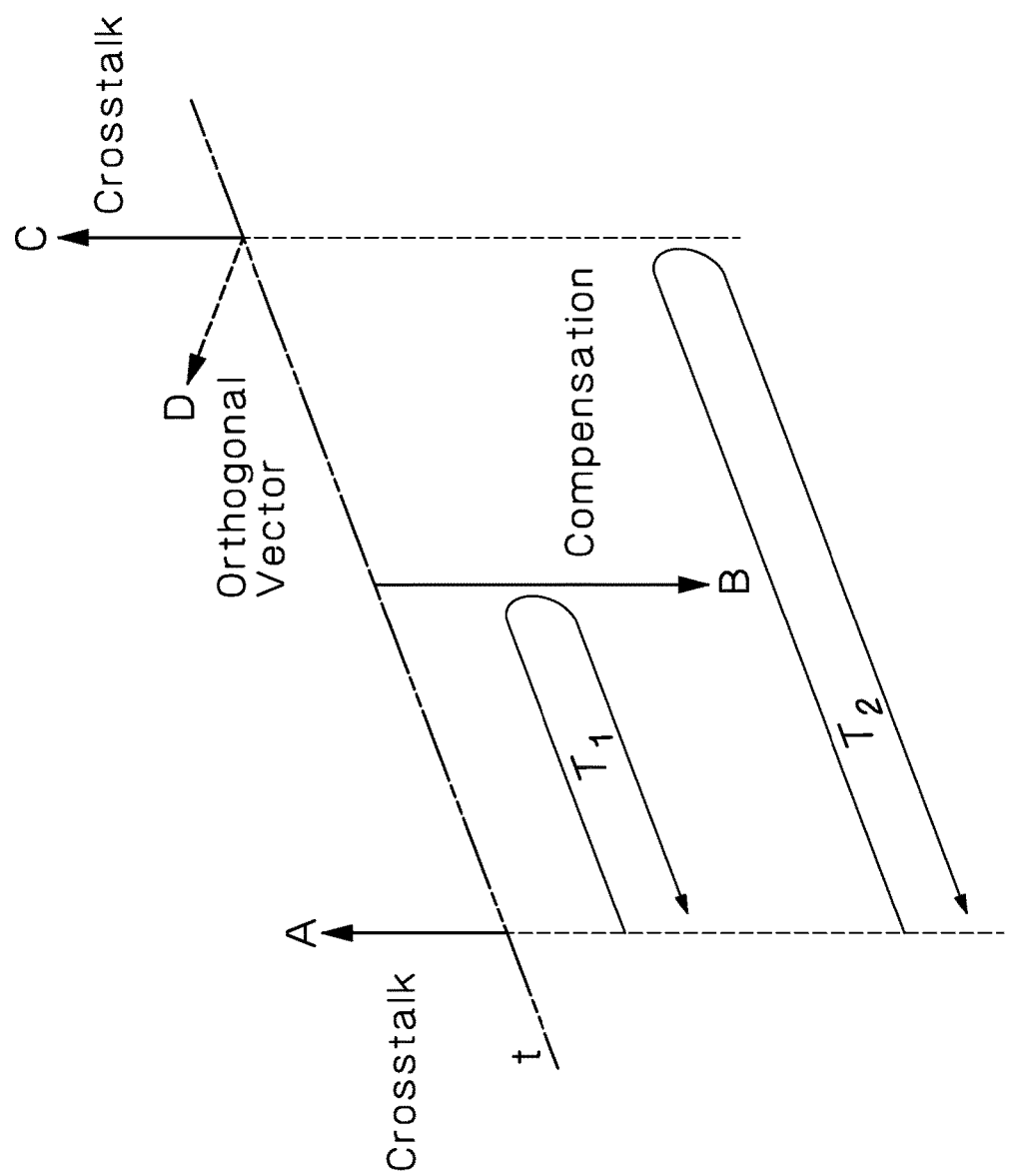
FIG. 6 illustrates a vector diagram for lumped approximation of a compensation technique in accordance with an embodiment of the present invention.

A lumped approximation of signal magnitude and polarity for signals generated by a combination of a plug mated to a jack having a compensation network according to the aforementioned embodiment is shown in FIG. 6. The additional vector D shown in FIG. 6 represents the added orthogonal vector. In a preferred embodiment, the orthogonal vector has a minimal magnitude at lower frequencies (at or below 500 MHz) and a sizeable magnitude at higher frequencies (at, approaching, or above 2000 MHz).

Figure 7:
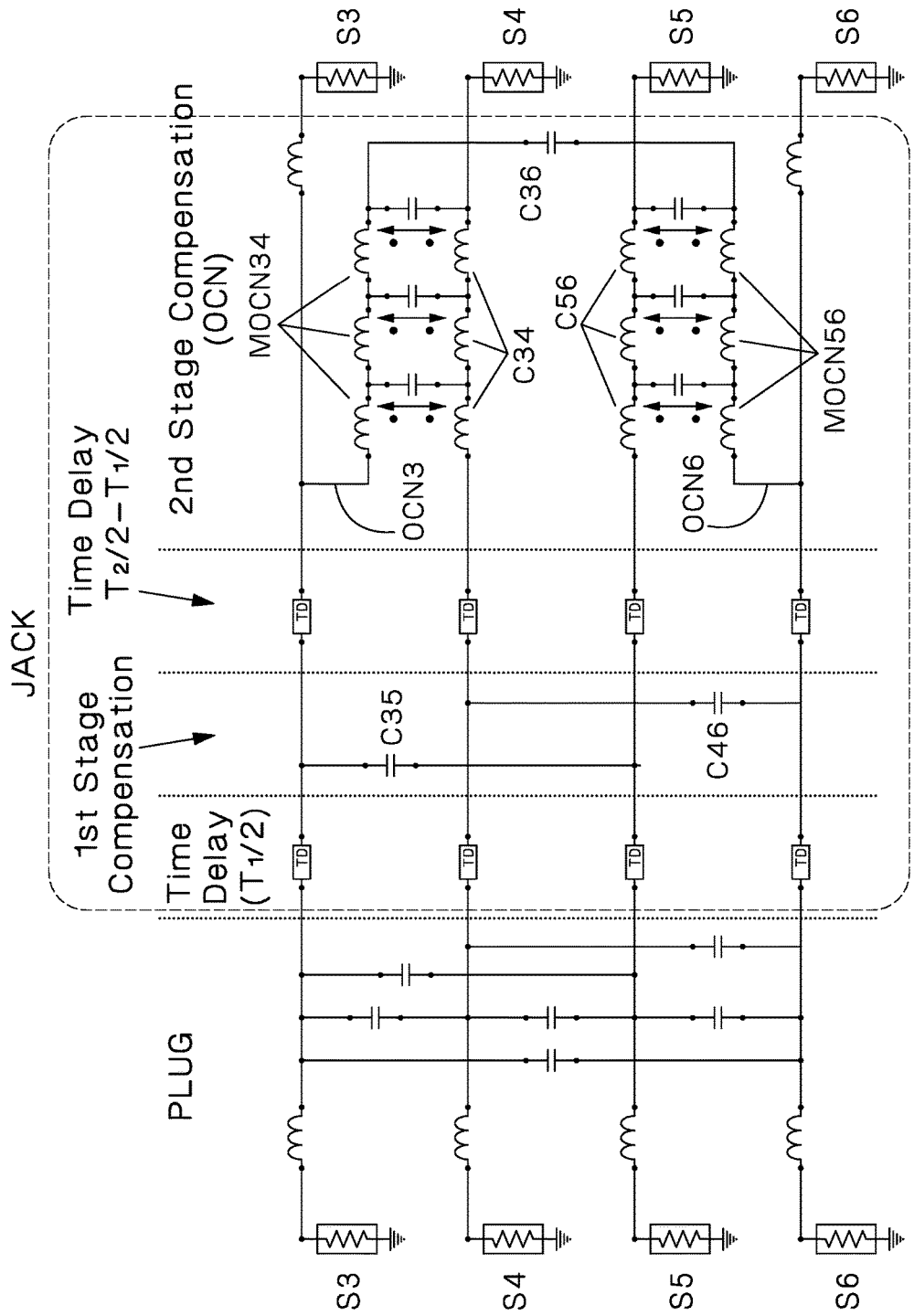
FIG. 7 illustrates a schematic for a mated plug/jack combination having a compensation network in accordance with an embodiment of the present invention.

An exemplary schematic illustrating a plug mated to a jack having a compensation network in accordance with an embodiment of the present invention is illustrated in FIG. 7. The schematic of FIG. 7 is illustrated with reference to the 4:5 and 3:6 conductor pairs (with signal traces S3 and S6 respectively corresponding to the 3 and 6 wires of the 3:6 wire pair, and with signal traces S4 and S5 respectively corresponding to the 4 and 5 wires of the 4:5 wire pair) and achieves the desired compensation between said pairs through inductive and capacitive couplings created within two separate compensation stages which are time-delayed with respect to each other.

The schematic is separated into five sections; Plug, Time Delay ($T_1/2$), 1st Stage Compensation, Time Delay ($T_2/2 - T_1/2$), and 2nd Stage Compensation (OCN). The Plug section illustrates couplings occurring in the plug and at the plug/jack interface. These are the couplings which are inherently present between the plug contacts and other elements of the plug and/or jack, and cause the crosstalk (represented by vector A in FIG. 6) that is later compensated for by the compensation network. The first Time Delay section represents the physical distance between the plug crosstalk and a first stage of compensation. This delay is equivalent to $T_1/2$ in FIG. 6. The 1st Stage Compensation section represents the first stage of a two-stage compensation network where signal trace S3 is coupled to signal trace S5 (C35) and signal trace S4 is coupled to signal trace S6 (C46). The net result of both of these couplings is represented as vector B in FIG. 6. The second Time Delay section represents the physical distance between the first stage of compensation and the second stage of compensation. This delay is equivalent to $T_2/2 - T_1/2$ in FIG. 6. Lastly, the 2nd Stage Compensation & OCN section represents the second stage of a two-stage compensation network where the desired compensation occurs by way of an OCN. In this section, offshoot traces OCN3 and OCN6 branch off of signal traces S3 and S6, respectively. A shunt capacitance is placed between the OCN3 and OCN6 offshoot traces, shunting signal traces S3 and S6, and enabling the OCN. The result of the OCN is that the desired coupling between wire-pair 4:5 and wire-pair 3:6 is achieved through capacitive couplings C34 and C56, and inductive couplings MOCN34 and MOCN56. To be more specific, signal trace S4 and the offshoot trace OCN3, in combination with the shunt capacitance C36, interact capacitively to create capacitive coupling C34 and interact inductively to create mutually inductive coupling MOCN34. Signal trace S5 and the offshoot trace OCN6, in combination with the shunt capacitance C36, interact capacitively to create capacitive coupling C56 and interact inductively to create mutually inductive coupling MOCN56. The net coupling of the OCN is illustrated by vectors C and D in FIG. 6, with vector C representing the net capacitive coupling between the signal traces and the offshoot traces, and vector D representing the net mutually inductive coupling between the signal traces and the offshoot traces in combination with the shunt capacitance.

In practice, the phase relationship between the orthogonal vector and its associated compensation vector is not always the ideal 90 degrees. This phase relationship can be dependent on the source and load impedance as well as the operating frequency. Consequently, in some cases, at 2000 MHz the phase difference between the 2nd stage compensation vector C and the orthogonal vector D may be significantly less than 90 degrees. Thus, in some embodiments, by adjusting the time delays $T_1/2$ and $T_2/2$, the phase relationship between the orthogonal vector D and the net crosstalk vector NEXT (as shown in FIG. 4) can be tuned closer to the ideal 180 degree relationship to increase the cancellation of the net crosstalk vector NEXT.

Figure 8:
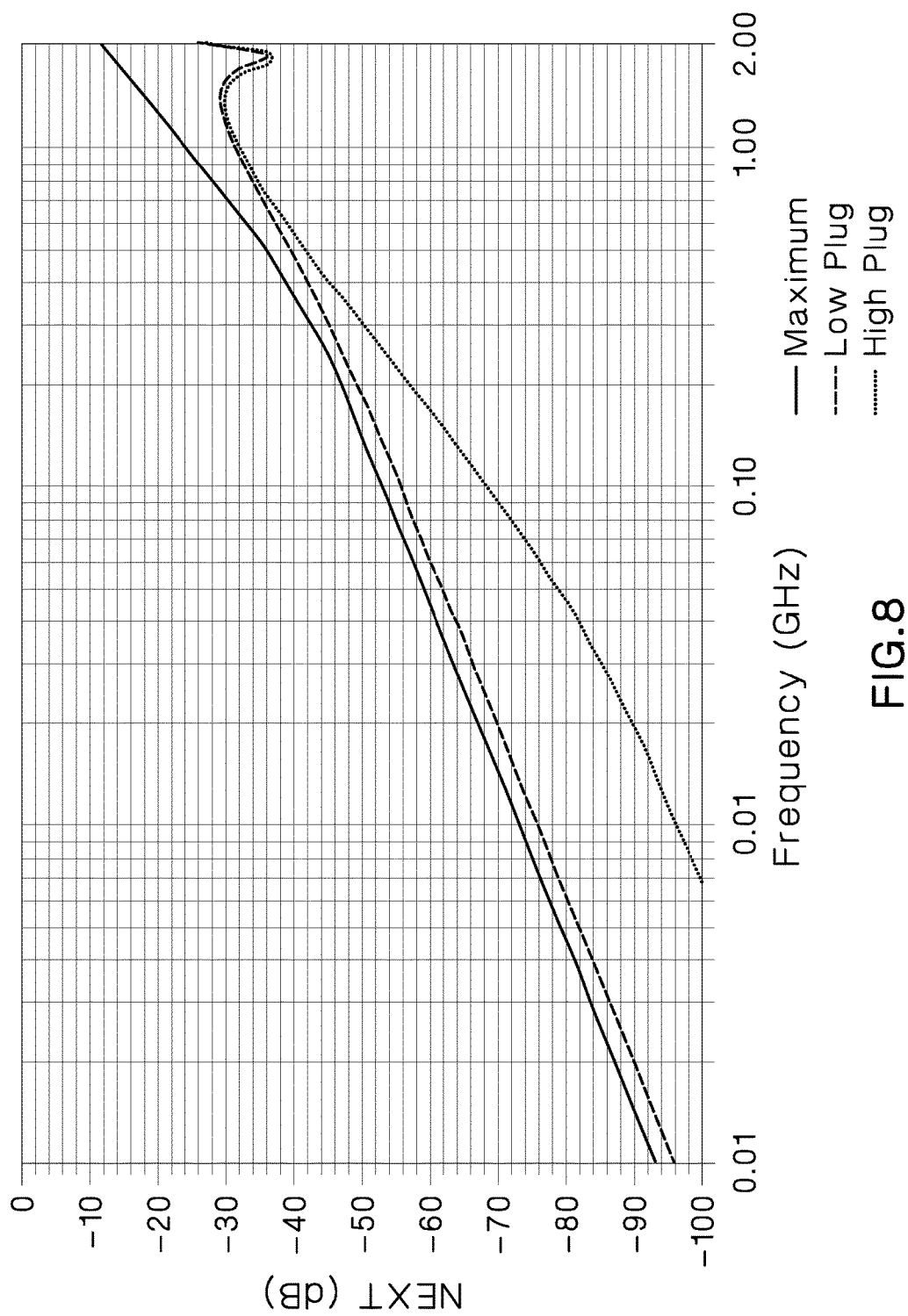
FIG. 8 illustrates NEXT on the 4:5-3:6 wire-pair combination for the mated plug and jack combination of FIG. 7 at 2000 MHz.
Figure 9:
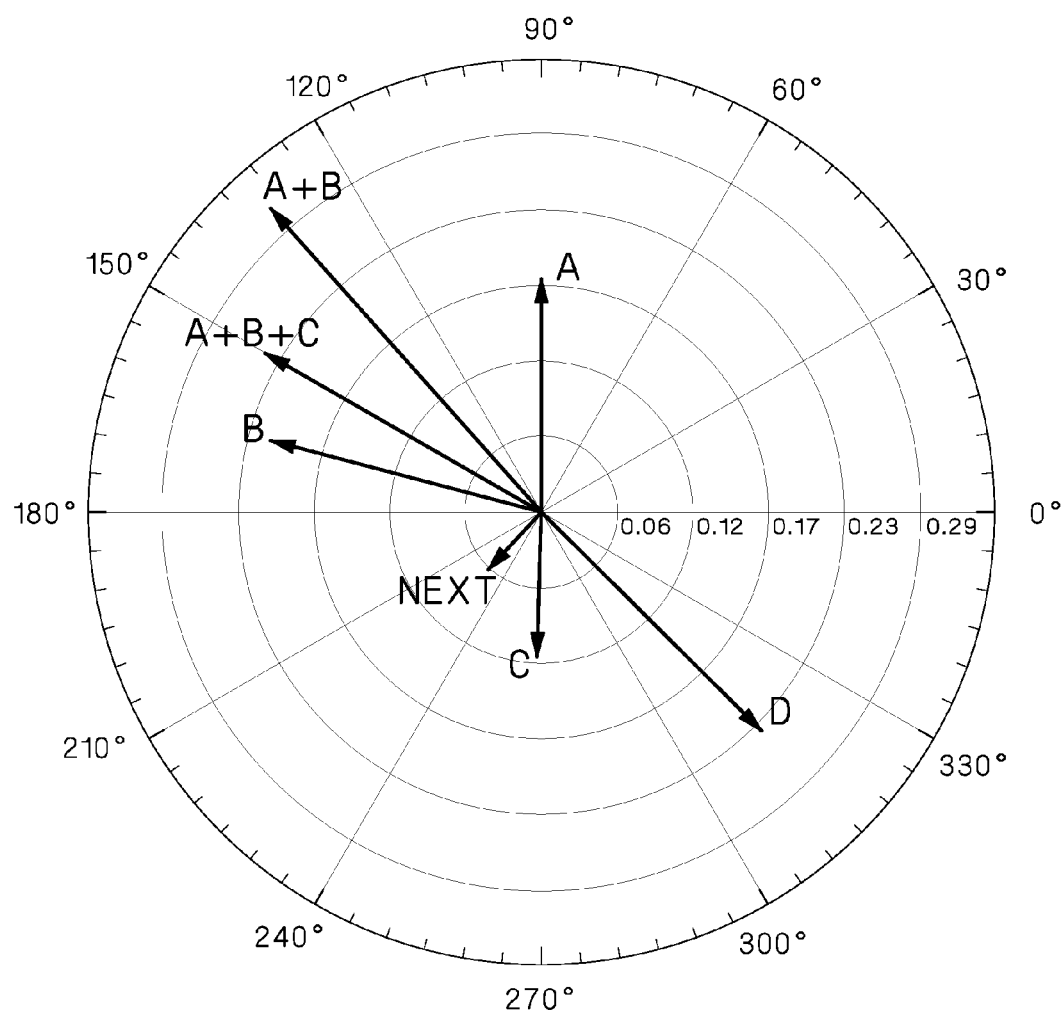
FIG. 9 illustrates a polar plot representative of the signals on the 4:5-3:6 wire-pair combination for the mated plug and jack combination of FIG. 7.

The overall NEXT performance of the compensation scheme of the aforementioned embodiment for pair combination 4:5-3:6 is shown in FIG. 8 along with a representative polar plot at 2000 MHz in FIG. 9. The advantage of incorporating the orthogonal vector D may be appreciated based on the magnitude and phase relationship between vector D and the resultant vector A+B+C (which represents the net summation result of vectors A, B, and C). Based on the results shown in FIG. 8, implementation of the improved two-stage compensation technique in accordance with one or more embodiments of the present invention may help meet the proposed specification outlined in Table 1 (or other proposed specifications) and provide a notable improvement over the traditional two-stage compensation technique.

Note that the above-described embodiment should not be interpreted as limiting in any way and other examples of two or more stage compensation networks which employ the OCN in at least one of those stages fall within the scope of present invention. Furthermore, the polarity or the signals produced by the capacitive coupling within these stages can, but does not have to, be opposite one another different stages may include capacitive coupling of the same polarity). Moreover, the direction of the phase shift of the orthogonal vector can be adjusted as needed for a particular implementation of the present invention. As such, the scope of the present invention extends to multi-stage crosstalk compensation networks having at least one OCN, where the signals produced by the multiple stages combine to cancel or otherwise sufficiently reduce a known amount of crosstalk (that is often present within a communication plug) at some predetermined frequencies (e.g., at or above 2 GHz).

Figure 10:
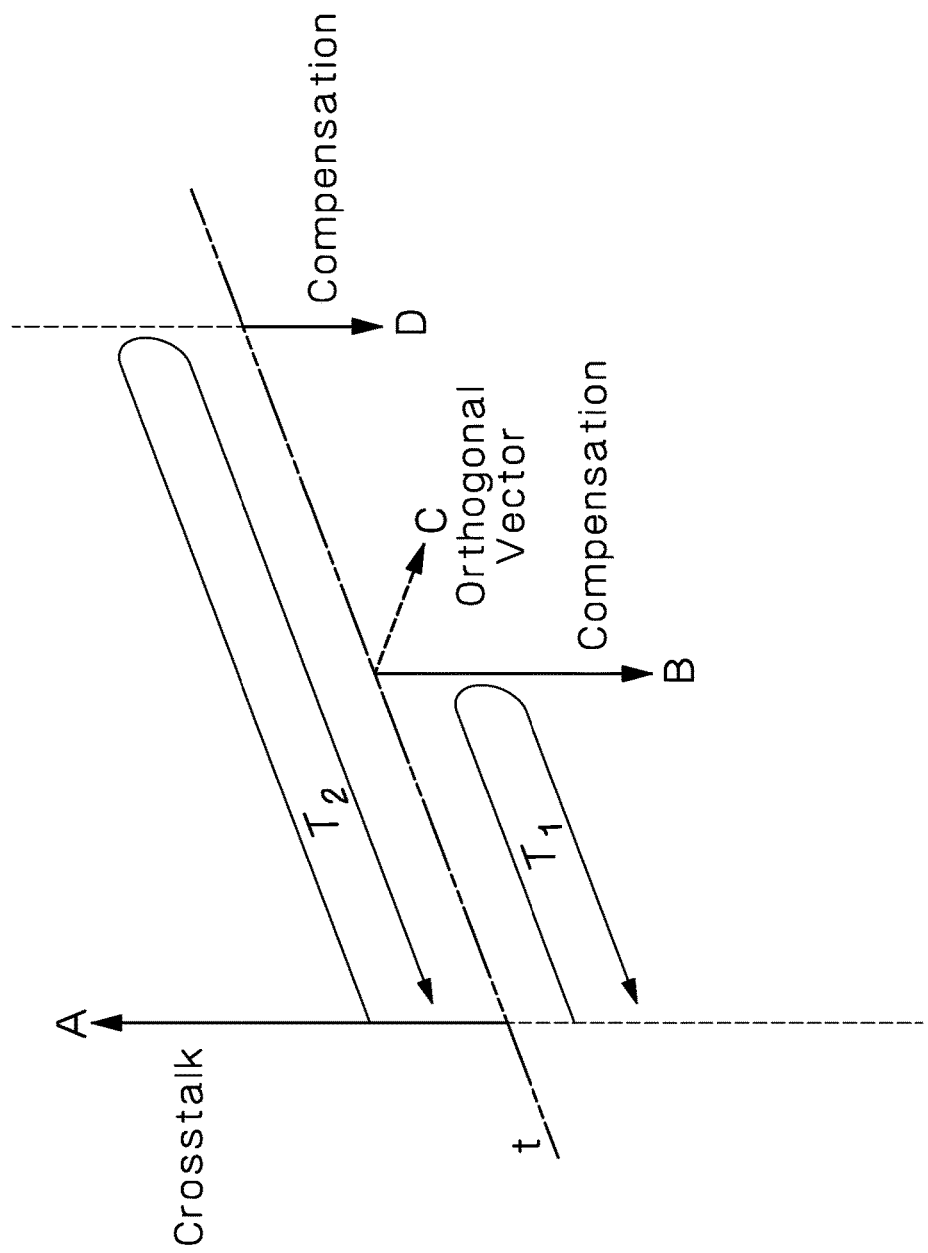
FIG. 10 illustrates a vector diagram for lumped approximation of a compensation technique in accordance with an embodiment of the present invention.

For example, a lumped approximation of signal magnitude and polarity for signals generated by a combination of a plug mated to a jack having a compensation network according to another embodiment is shown in FIG. 10. In this embodiment, the compensation network employs an OCN in its first stage and a non-OCN compensation technique in its second stage. The capacitive couplings produced by both the OCN (represented by vector B) and the second stage (represented by vector D) produce signals that are of the same polarity and would typically be considered compensation as they are opposite of the plug crosstalk (represented by vector A). The OCN further includes an orthogonal component (represented by vector C) which is phase-shifted approximately 90 degrees relative to the OCN's capacitive coupling component.

Figure 11:
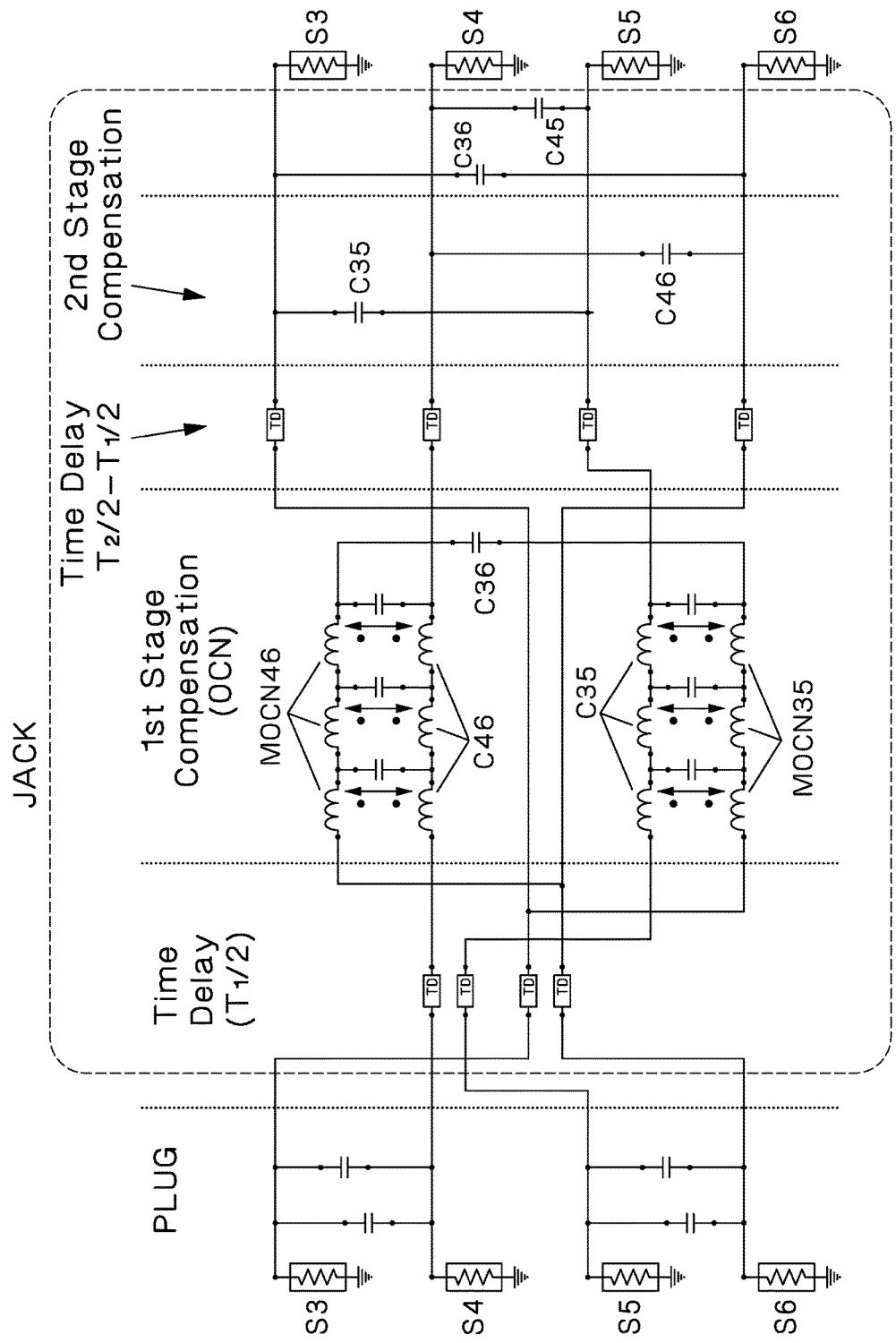
FIG. 11 illustrates a schematic for a mated plug/jack combination having a compensation network in accordance with an embodiment of the present invention.

One exemplary way of implementing the currently described embodiment in a mated plug/jack combination is illustrated in the schematic diagram shown in FIG. 11. This schematic is illustrated with reference to the 4:5 and 3:6 conductor pairs (with signal traces S3 and S6 respectively corresponding to the 3 and 6 wires of the 3:6 wire pair, and with signal traces S4 and S5 respectively corresponding to the 4 and 5 wires of the 4:5 wire pair). This schematic is separated into five sections: Plug, Time Delay ($T_1/2$), 1st Stage Compensation (OCN), Time Delay ($T_2/2-T_1/2$), and 2nd Stage Compensation. The Plug section illustrates the inherent couplings present in the plug and at the plug/jack interface which produce some levels of crosstalk. Referring to FIG. 10, this coupling is represented by vector A. The first Time Delay ($T_1/2$) section is the time delay separating the crosstalk produced in the Plug/Nose section and the first compensation stage. The OCN section is the first stage of the compensation implemented in the jack. Referring to FIG. 10, the coupling produced by the OCN section is represented by the B and C vectors. Vector B is realized by the net result of capacitive couplings C35 and C46. Vector C is realized by the net result of mutually inductive couplings MOCN35 and MOCN46, in combination with the shunt capacitance C36. The second Time Delay ($T_2/2-T_1/2$) section is the time delay separating the first stage of the compensation produced in the jack and the second stage of the total compensation produced in the jack. This time delay primarily determines the delay between vector B and D. Lastly, the 2nd Stage Compensation section shows the second stage of the compensation implemented in the jack. This compensation is achieved by implementing capacitive couplings C35 and C46, coupling signal traces 3 and 5, and 4 and 6, respectively. Referring to FIG. 10, this coupling is represented by vector D.

Figure 12:
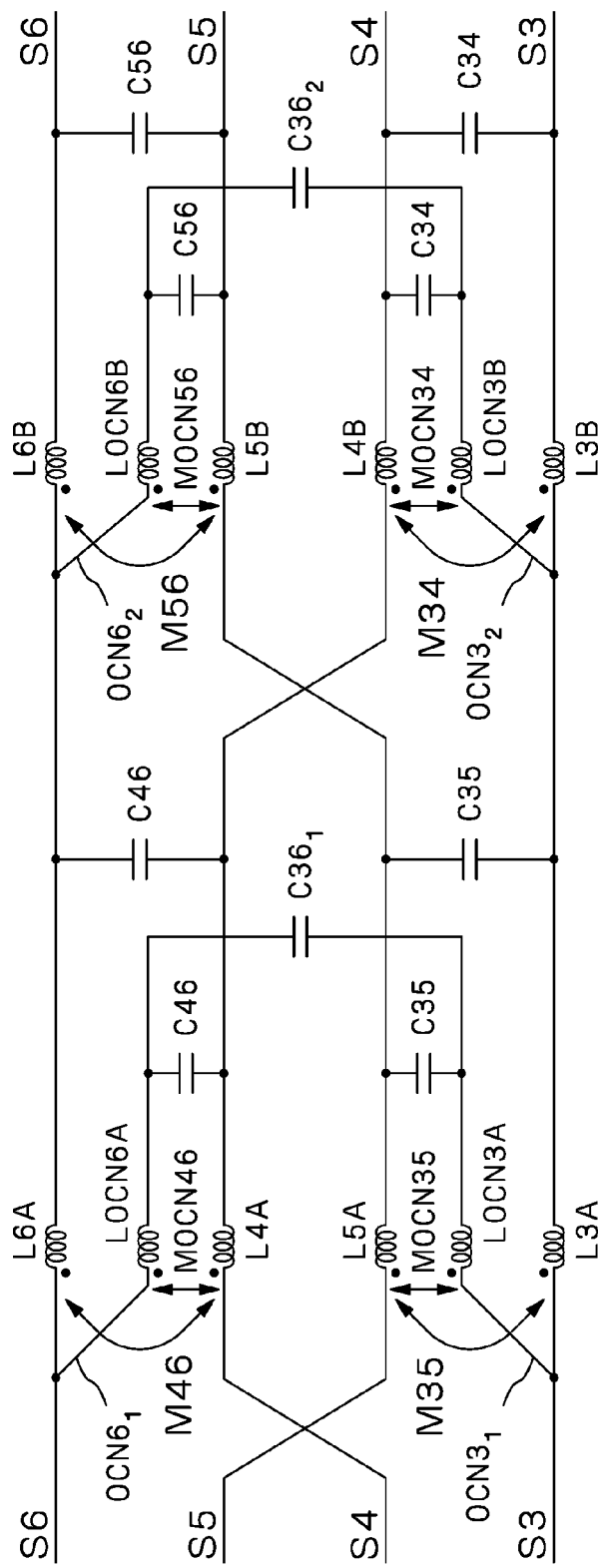
FIG. 12 illustrates a schematic for a compensation network in accordance with an embodiment of the present invention.

FIG. 12 schematically illustrates another embodiment of a compensation network in accordance with the present invention. The couplings indicated on the schematic may be achieved by way of discrete elements, distributed couplings, or any combinations thereof. The network of FIG. 12 is illustrated with reference to the 4:5 and 3:6 conductor pairs and achieves the desired compensation between said pairs through inductive and capacitive couplings created within two separate compensation stages which are time-delayed with respect to each other.

The first compensation stage uses signal traces S3, S4, S5, and S6, and offshoot traces $OCN3_1$ and $OCN6_1$ to create the desired first-stage compensation signal. A $C36_1$ capacitive coupling (e.g., pad capacitor) positioned between offshoot traces $OCN3_1$ and $OCN6_1$ (shunting signal traces S3 and S6) enables the OCN component of the first compensation stage. In particular, the desired coupling between wire-pair 4:5 and wire-pair 3:6 is achieved through capacitive couplings C35 and C46, inductive couplings M35 and M46, and inductive couplings MOCN35 and MOCN46. Signal traces S3 and S5 interact capacitively to create a part of the capacitive coupling C35 and interact inductively to create the mutually inductive coupling M35. Signal trace S5 and the offshoot trace $OCN3_1$, in combination with the shunt capacitance $C36_1$, interact capacitively to create another part of the capacitive coupling C35 and interact inductively to create mutually inductive coupling MOCN35. Signal traces S4 and S6 interact capacitively to create a part of the capacitive coupling C46 and interact inductively to create the mutually inductive coupling M46. Signal trace S4 and the offshoot trace $OCN6_1$, in combination with the shunt capacitance $C36_1$, interact capacitively to create another part of the capacitive coupling C46 and interact inductively to create mutually inductive coupling MOCN46. Since this first compensation stage generally provides coupling between traces 3 and 5, and 4 and 6, the net resultant signal produced by this network would typically be considered a compensation signal.

The second compensation stage uses signal traces S3, S4, S5, and S6, and offshoot traces $OCN3_2$ and $OCN6_2$ to create the desired second-stage compensation signal. A $C36_2$ capacitive coupling (e.g., pad capacitor) positioned between offshoot traces $OCN3_2$ and $OCN6_2$ (shunting signal traces S3 and S6) enables the OCN component of the second compensation stage. In particular, the desired coupling between wire-pair 4:5 and wire-pair 3:6 is achieved through capacitive couplings C34 and C56, inductive couplings M34 and M56, and inductive couplings MOCN34 and MOCN56. Signal traces S3 and S4 interact capacitively to create a part of the capacitive coupling C34 and interact inductively to create the mutually inductive coupling M34. Signal trace S4 and the offshoot trace $OCN3_2$, in combination with the shunt capacitance $C36_2$, interact capacitively to create another part of the capacitive coupling C34 and interact inductively to create mutually inductive coupling MOCN34. Signal traces S5 and S6 interact capacitively to create a part of the capacitive coupling C56 and interact inductively to create the mutually inductive coupling M56. Signal trace S5 and the offshoot trace OCN62, in combination with the shunt capacitance $C36_2$, interact capacitively to create another part of the capacitive coupling C56 and interact inductively to create mutually inductive coupling MOCN56. Since this second compensation stage generally provides coupling between traces 3 and 4, and 5 and 6, the net resultant signal produced by this network would typically be considered a crosstalk signal.

Figure 13A:
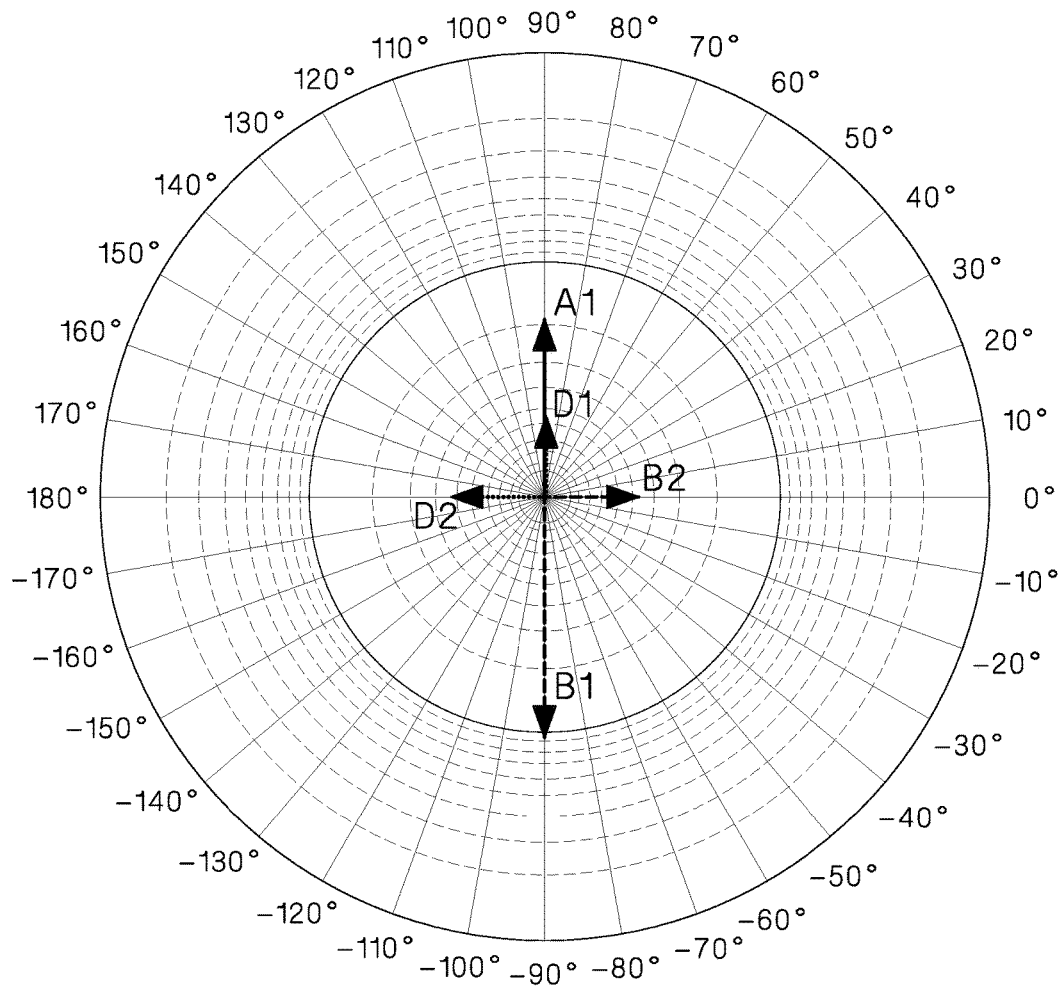
FIGS. 13A and 13B illustrate polar plots representative of the performance of the compensation network of FIG. 12 at different frequencies.
Figure 13B:
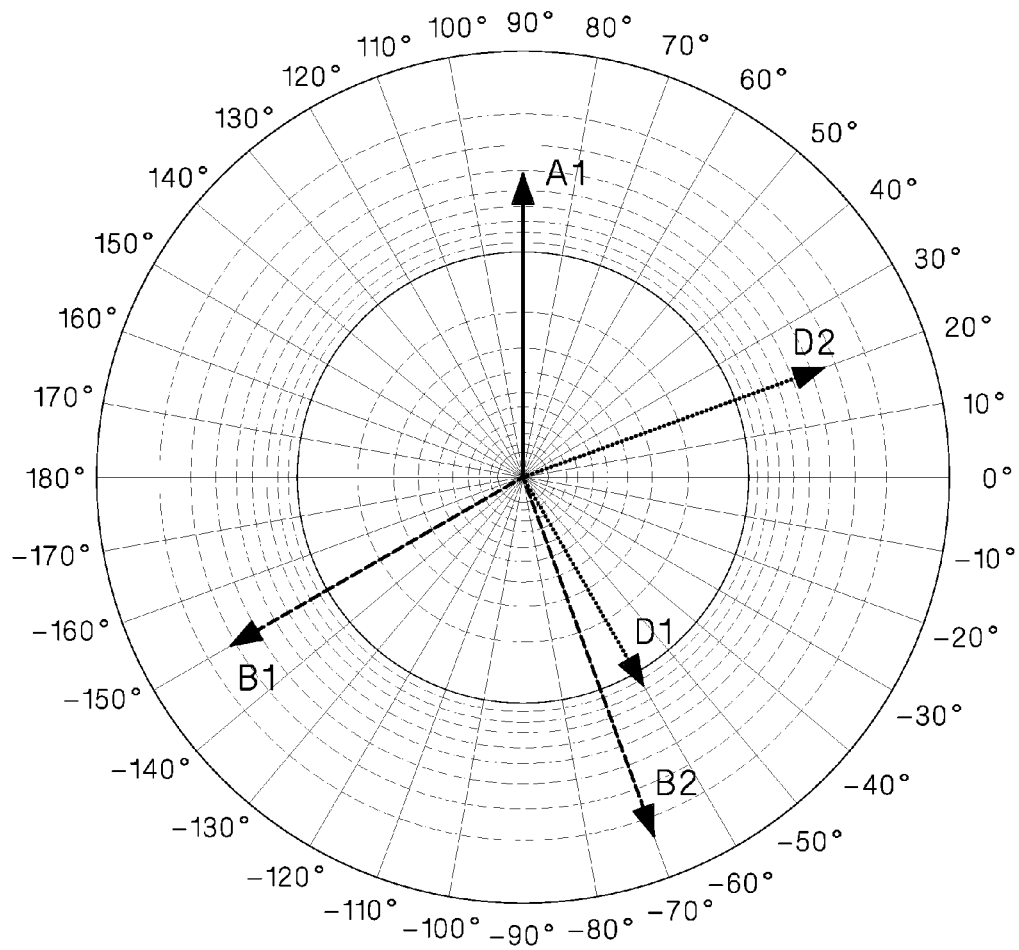

FIGS. 13A and 13B illustrate polar plots representative of the compensation network of FIG. 12 at 10 MHz and 2000 MHz, respectively. The crosstalk produced in the plug and the plug/jack mating region is represented by the "A1" vector with a phase of approximately 90 degrees. The resulting signal of the first compensation stage is illustrated by vectors "B1" and "B2." Vector "B1" represents the signal produced by the net coupling of C35, C46, M35, and M46, and has a polarity that is approximately opposite of the polarity of the signal represented by the plug vector "A1." Vector "B2" represents the signal produced by the net coupling of MOCN35 and MOCN46, both in combination with capacitive coupling $C36_1$, and has a polarity that is approximately orthogonal to the vector "B1." The resulting signal of the second compensation stage is illustrated by vectors "D1" and "D2." Vector "D1" represents the signal produced by the net coupling of C34, C56, M34, and M56, and has a polarity that is approximately the same as the signal represented by the plug vector "A1." Vector "D2" represents the signal produced by the net coupling of MOCN34 and MOCN56, both in combination with capacitive coupling $C36_2$, and has a polarity that is approximately orthogonal to the vector "D1."

Figure 14:
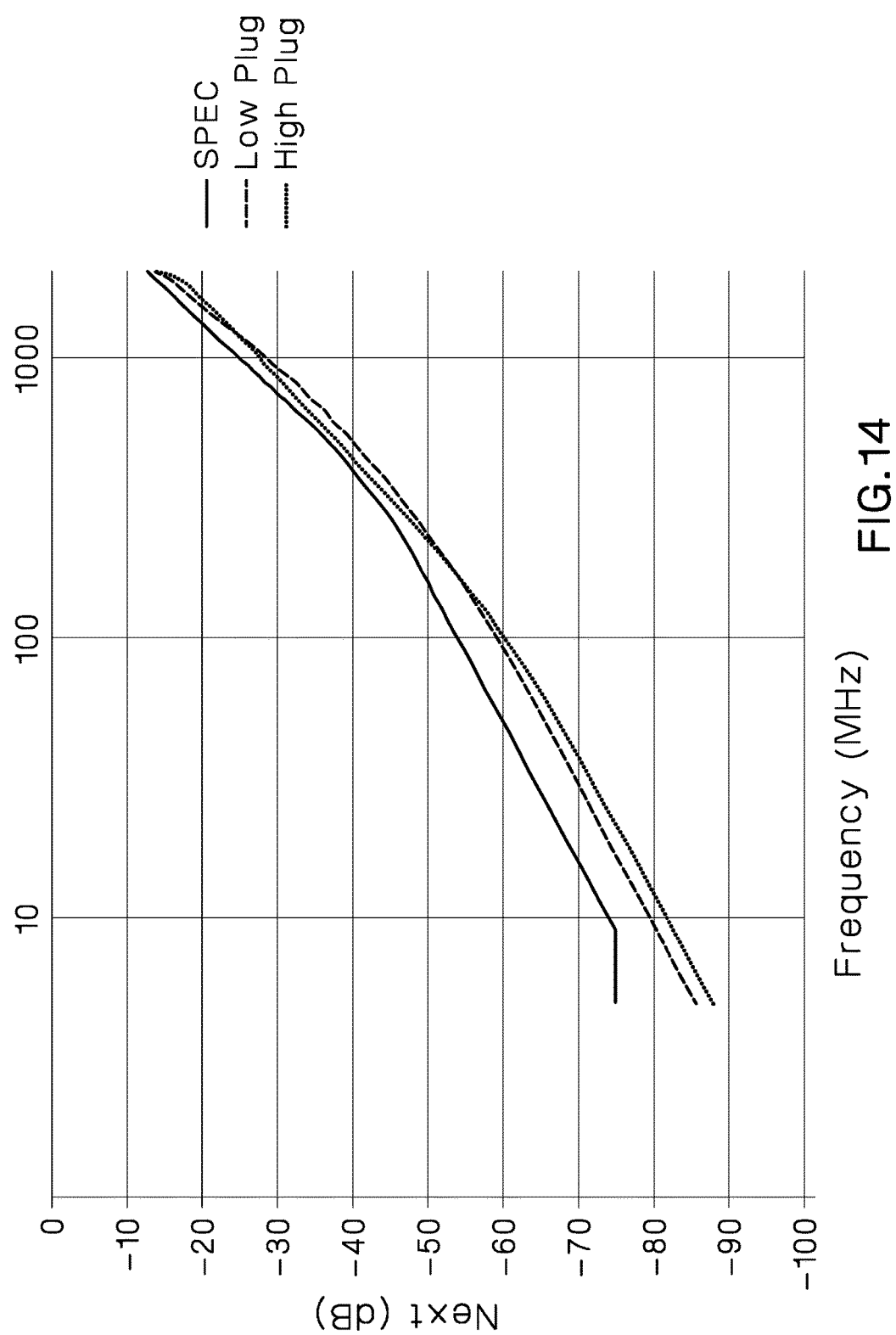
FIG. 14 illustrates potential results for a compensation network of FIG. 12.

FIG. 14 shows a model that illustrates the potential performance of the compensation network of FIG. 12. The performance of the compensation network is illustrated by the dashed lines relative to a potential standard illustrated by the solid line. The results of this model indicate that if the compensation network of FIG. 12 is implemented in a communication jack such as an RJ45 jack, it may be possible to achieve NEXT performance which may allow operational bandwidth of up to 2 GHz and beyond.

In one embodiment, the coupling elements of the compensation network of FIG. 12 have the following values:

| First compensation stage | Second compensation stage |
| --- | --- |
| C35 is approximately 0.69 pF | C34 is approximately 0.24 pF |
| C46 is approximately 0.69 pF | C56 is approximately 0.24 pF |
| M35 is approximately 0.6895 nH | M34 is approximately .015 nH |
| M46 is approximately 0.6895 nH | M56 is approximately 0.15 nH |
| MOCN35 is approximately 1.9 nH | MOCN34 is approximately 1.4 nH |
| MOCN46 is approximately 1.9 nH | MOCN56 is approximately 1.4 nH |
| $C36_1$ is approximately 1 pF | $C36_2$ is approximately 0.9 pF |

The first compensation stage is positioned approximately 30 ps (picoseconds) from the centroid of the crosstalk caused by the plug and/or plug/jack interface. The second compensation stage is positioned approximately 2.0 ps away from the first stage. As an exemplary reference, with a relative dielectric of 2, 30 ps equates to a distance of about 0.250 inches and 20 ps equates to a distance of about 0.167 inches.

Figure 15:
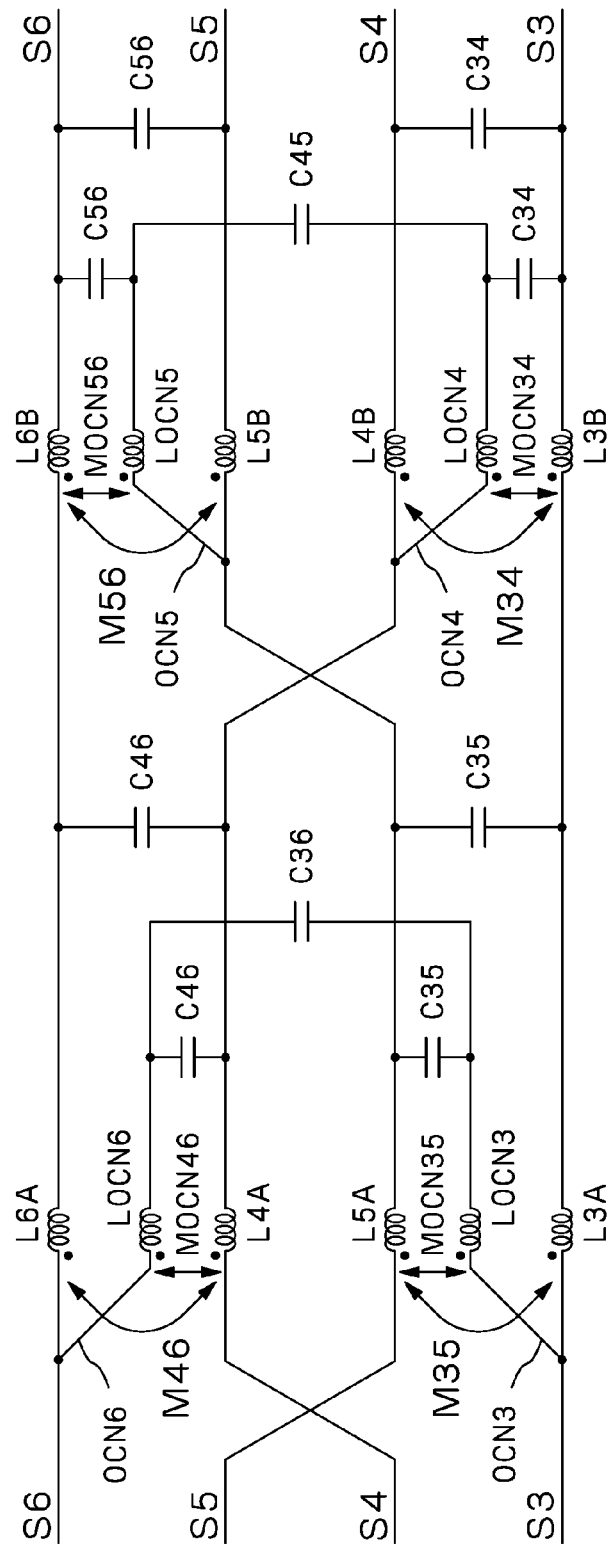
FIG. 15 illustrates a crosstalk compensation network according to another embodiment of the present invention.

FIG. 15 schematically illustrates another embodiment of a compensation network in accordance with the present invention. The couplings indicated, on the schematic may be achieved by way of discrete elements, distributed couplings, or any combinations thereof. The network of FIG. 15 is illustrated with reference to the 4:5 and 3:6 conductor pairs and achieves the desired compensation between said pairs through inductive and capacitive couplings created within two separate compensation stages which are time-delayed with respect to each other.

The first compensation stage uses signal traces S3, S4, S5, and S6, and offshoot traces OCN3 and OCN6 to create the desired first-stage compensation signal. A C36 capacitive coupling (e.g., pad capacitor) positioned between offshoot traces OCN3 and OCN6 (shunting signal traces S3 and S6) enables the OCN component of the first compensation stage. In particular, the desired coupling between wire-pair 4:5 and wire-pair 3:6 is achieved through capacitive couplings C35 and C46, inductive couplings M35 and M46, and inductive couplings MOCN35 and MOCN46. Signal traces S3 and S5 interact capacitively to create a part of the capacitive coupling C35 and interact inductively to create the mutually inductive coupling M35. Signal trace S5 and the offshoot trace OCN3, in combination with the shunt capacitance C36, interact capacitively to create another part of the capacitive coupling C35 and interact inductively to create mutually inductive coupling MOCN35. Signal traces S4 and S6 interact capacitively to create a part of the capacitive coupling C46 and interact inductively to create the mutually inductive coupling M46. Signal trace S4 and the offshoot trace OCN6, in combination with the shunt capacitance C36, interact capacitively to create another part of the capacitive coupling C46 and interact inductively to create mutually inductive coupling MOCN46. Since this first compensation stage generally provides coupling between traces 3 and 5, and 4 and 6, the net resultant signal produced by this network would typically be considered a compensation signal.

The second compensation stage uses signal traces S3, S4, S5, and S6, and offshoot traces OCN4 and OCN5 to create the desired second-stage compensation signal. A C45 capacitive coupling (e.g., pad capacitor) positioned between offshoot traces OCN4 and OCN5 (shunting signal traces S4 and S5) enables the OCN component of the second compensation stage. In particular, the desired coupling between wire-pair 4:5 and wire-pair 3:6 is achieved through capacitive couplings C34 and C56, inductive couplings M34 and M56, and inductive couplings MOCN34 and MOCN56. Signal traces S3 and S4 interact capacitively to create a part of the capacitive coupling C34 and interact inductively to create the mutually inductive coupling M34, Signal trace S3 and the offshoot trace OCN4, in combination with the shunt capacitance C45, interact capacitively to create another part of the capacitive coupling C34 and interact inductively to create mutually inductive coupling MOCN34. Signal traces S5 and S6 interact capacitively to create a part of the capacitive coupling C56 and interact inductively to create the mutually inductive coupling M56. Signal trace S6 and the offshoot trace OCN5, in combination with the shunt capacitance C45, interact capacitively to create another part of the capacitive coupling C56 and interact inductively to create mutually inductive coupling MOCN56. Since this second compensation stage generally provides coupling between traces 3 and 4, and 5 and 6, the net resultant signal produced by this network would typically be considered a crosstalk signal. The net resultant coupling of the compensation network of FIG. 15 may provide additional NEXT bandwidth which may help to allow wire-pair combination 4:5-3:6 to meet potential standards for 40 GBASE-T and beyond.

Figure 16:
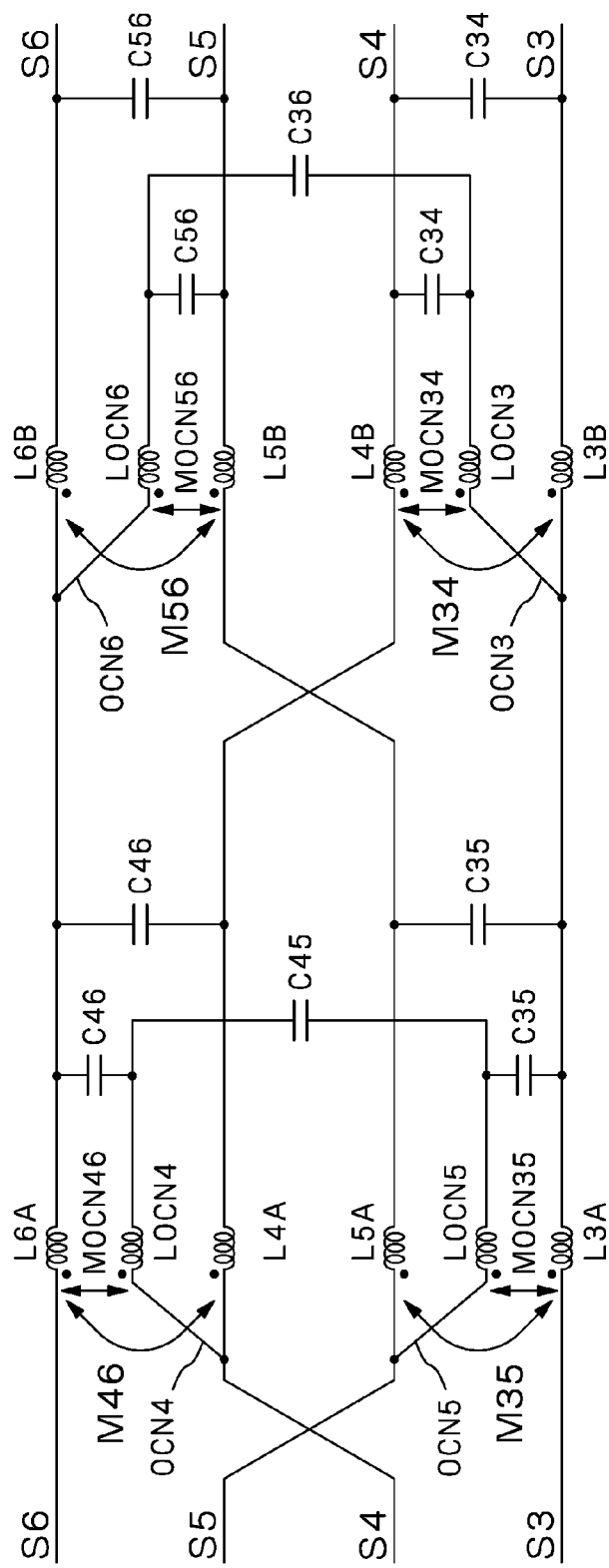
FIG. 16 illustrates a crosstalk compensation network according to another embodiment of the present invention.

FIG. 16 schematically illustrates another embodiment of a compensation network in accordance with the present invention. The couplings indicated on the schematic may be achieved by way of discrete elements, distributed couplings, or any combinations thereof. The network of FIG. 16 is illustrated with reference to the 4:5 and 3:6 conductor pairs and achieves the desired compensation between said pairs through inductive and capacitive couplings created within two separate compensation stages which are time-delayed with respect to each other.

The first compensation stage uses signal traces S3. S4, S5, and S6, and offshoot traces OCN4 and OCN5 to create the desired first-stage compensation signal. A C45 capacitive coupling (e.g., pad capacitor) positioned between offshoot traces OCN4 and OCN5 (shunting signal traces S4 and S5) enables the OCN component of the first compensation stage. In particular, the desired coupling between wire-pair 4:5 and wire-pair 3:6 is achieved through capacitive couplings C35 and C46, inductive couplings M35 and M46, and inductive couplings MOCN35 and MOCN46. Signal traces S3 and S5 interact capacitively to create a part of the capacitive coupling C35 and interact inductively to create the mutually inductive coupling M35. Signal trace S3 and the offshoot trace OCN5, in combination with the shunt capacitance C45, interact capacitively to create another part of the capacitive coupling C35 and interact inductively to create mutually inductive coupling MOCN35. Signal traces S4 and S6 interact capacitively to create a part of the capacitive coupling C46 and interact inductively to create the mutually inductive coupling M46. Signal trace S6 and the offshoot trace OCN4, in combination with the shunt capacitance C45, interact capacitively to create another part of the capacitive coupling C46 and interact inductively to create mutually inductive coupling MOCN46. Since this first compensation stage generally provides coupling between traces 3 and 5, and 4 and 6, the net resultant signal produced by this network would typically be considered a compensation signal.

The second compensation stage uses signal traces S3, S4, S5, and S6, and offshoot traces OCN3 and OCN6 to create the desired second-stage compensation signal. A C36 capacitive coupling (e.g., pad capacitor) positioned between offshoot traces OCN3 and OCN6 (shunting signal traces S3 and S6) enables the OCN component of the second compensation stage. In particular, the desired coupling between wire-pair 4:5 and wire-pair 3:6 is achieved through capacitive couplings C34 and C56, inductive couplings M34 and M56, and inductive couplings MOCN34 and MOCN56. Signal traces S3 and S4 interact capacitively to create a part of the capacitive coupling C34 and interact inductively to create the mutually inductive coupling M34. Signal trace S4 and the offshoot trace OCN3, in combination with the shunt capacitance C36, interact capacitively to create another part of the capacitive coupling C34 and interact inductively to create mutually inductive coupling MOCN34. Signal traces S5 and S6 interact capacitively to create a part of the capacitive coupling C56 and interact inductively to create the mutually inductive coupling M56. Signal trace S5 and the offshoot trace OCN6, in combination with the shunt capacitance C36, interact capacitively to create another part of the capacitive coupling C56 and interact inductively to create mutually inductive coupling MOCN56. Since this second compensation stage generally provides coupling between traces 3 and 4, and 5 and 6, the net resultant signal produced by this network would typically be considered a crosstalk signal. The net resultant coupling of the compensation network of FIG. 16 may provide additional NEXT bandwidth which may help to allow wire-pair combination 4:5-3:6 to meet potential standards for 40 GBASE-T and beyond.

Figure 17:
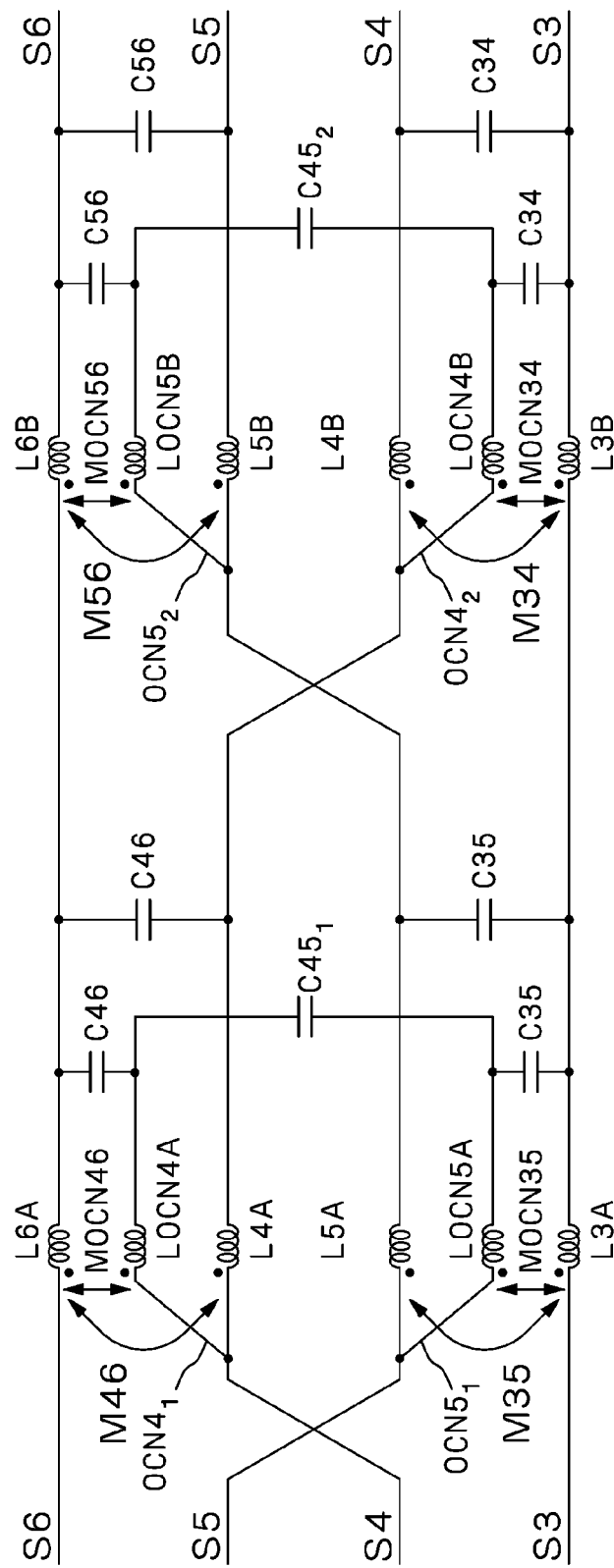
FIG. 17 illustrates a crosstalk compensation network according to another embodiment of the present invention.

FIG. 17 schematically illustrates another embodiment of a compensation network in accordance with the present invention. The couplings indicated on the schematic may be achieved by way of discrete elements, distributed couplings, or any combinations thereof. The network of FIG. 17 is illustrated with reference to the 4:5 and 3:6 conductor pairs and achieves the desired compensation between said pairs through inductive and capacitive couplings created within two separate compensation stages which are time-delayed with respect to each other.

The first compensation stage uses signal traces S3, S4, S5, and S6, and offshoot traces $OCN4_1$ and $OCN5_1$ to create the desired first-stage compensation signal. A $C45_1$ capacitive coupling (e.g., pad capacitor) positioned between offshoot traces $OCN4_1$ and $OCN5_1$ (shunting signal traces S4 and S5) enables the OCN component of the first compensation stage. In particular, the desired coupling between wire-pair 4:5 and wire-pair 3:6 is achieved through capacitive couplings C35 and C46, inductive couplings M35 and M46, and inductive couplings MOCN35 and MOCN46. Signal traces S3 and S5 interact capacitively to create a part of the capacitive coupling C35 and interact inductively to create the mutually inductive coupling M35. Signal trace S3 and the offshoot trace $OCN5_1$, in combination with the shunt capacitance $C45_1$, interact capacitively to create another part of the capacitive coupling C35 and interact inductively to create mutually inductive coupling MOCN35. Signal traces S4 and S6 interact capacitively to create a part of the capacitive coupling C46 and interact inductively to create the mutually inductive coupling M46. Signal trace S6 and the offshoot trace $OCN4_1$, in combination with the shunt capacitance $C45_1$, interact capacitively to create another part of the capacitive coupling C46 and interact inductively to create mutually inductive coupling MOCN46. Since this first compensation stage generally provides coupling between traces 3 and 5, and 4 and 6, the net resultant signal produced by this network would typically be considered a compensation signal.

The second compensation stage uses signal traces S3, S4, S5, and S6, and offshoot traces $OCN4_2$ and $OCN5_2$ to create the desired second-stage compensation signal. A $C45_2$ capacitive coupling (e.g., pad capacitor) positioned between offshoot traces $OCN4_2$ and $OCN5_2$ (shunting signal traces S4 and S5) enables the OCN component of the second compensation stage. In particular, the desired coupling between wire-pair 4:5 and wire-pair 3:6 is achieved through capacitive couplings C34 and C56, inductive couplings M34 and M56, and inductive couplings MOCN34 and MOCN56. Signal traces S3 and S4 interact capacitively to create a part of the capacitive coupling C34 and interact inductively to create the mutually inductive coupling M34. Signal trace S3 and the offshoot trace $OCN4_2$, in combination with the shunt capacitance $C45_2$, interact capacitively to create another part of the capacitive coupling C34 and interact inductively to create mutually inductive coupling MOCN34. Signal traces S5 and S6 interact capacitively to create a part of the capacitive coupling C56 and interact inductively to create the mutually inductive coupling M56. Signal trace S6 and the offshoot trace OCN5$_2$, in combination with the shunt capacitance C45$_2$, interact capacitively to create another part of the capacitive coupling C56 and interact inductively to create mutually inductive coupling MOCN56. Since this second compensation stage generally provides coupling between traces 3 and 4, and 5 and 6, the net resultant signal produced by this network would typically be considered a crosstalk signal. The net resultant coupling of the compensation network of FIG. 17 may provide additional NEXT bandwidth which may help to allow wire-pair combination 4:5-3:6 to meet potential standards for 40 GBASE-T and beyond.

Figure 18:
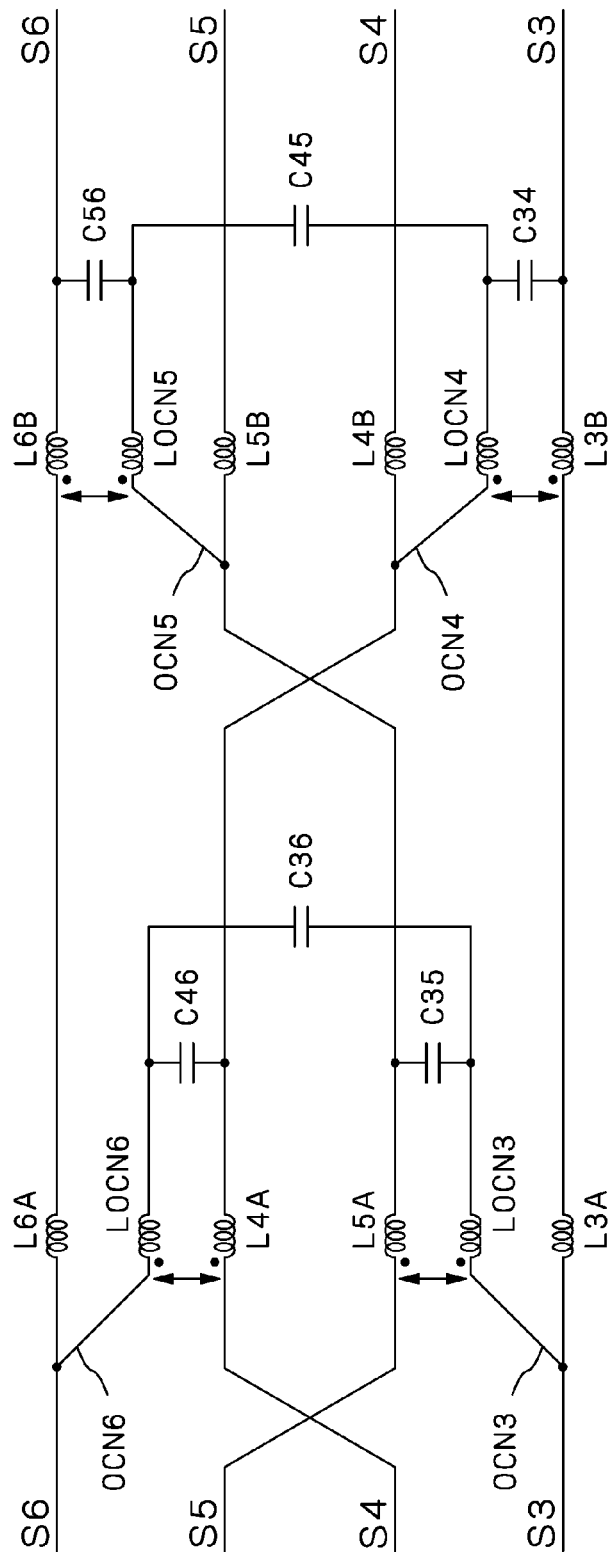
FIG. 18 illustrates a crosstalk compensation network according to another embodiment the present invention.

In another embodiment of the present invention, it is possible to execute the PCB artwork in such a way that capacitive and inductive couplings described in the embodiments of FIGS. 13, 15, 16, and 17 occur primarily between the offshoot traces and the signal traces to which they would normally couple to. In such an embodiment, there is no intentional signal trace-to-signal trace coupling. In other words, the signal traces would be positioned on the PCB such that direct coupling between them would be insignificant. A schematically illustrated example of the currently described embodiment is shown in FIG. 18. The couplings indicated on the schematic may be achieved by way of discrete elements, distributed couplings, or any combinations thereof. The network of FIG. 18 is illustrated with reference to the 4:5 and 3:6 conductor pairs and achieves the desired compensation between said pairs through inductive and capacitive couplings created within two separate compensation stages which are time-delayed with respect to each other.

The first compensation stage uses signal traces S4 and S5, and offshoot traces OCN3 and OCN6 to create the desired first-stage compensation signal. A C36 capacitive coupling (e.g., pad capacitor) positioned between offshoot traces OCN3 and OCN6 (shunting signal traces S3 and S6) enables the OCN component of the first compensation stage. In particular, the desired coupling between wire-pair 4:5 and wire-pair 3:6 is achieved through capacitive couplings C35 and C46, and inductive couplings MOCN35 and MOCN46. Signal trace S5 and the offshoot trace OCN3, in combination with the shunt capacitance C36, interact capacitively to create capacitive coupling C35 and interact inductively to create mutually inductive coupling MOCN35. Signal trace S4 and the offshoot trace OCN6, in combination with the shunt capacitance C36, interact capacitively to create capacitive coupling C46 and interact inductively to create mutually inductive coupling MOCN46. Since this first compensation stage generally provides coupling between traces 3 and 5, and 4 and 6, the net resultant signal produced by this network would typically be considered a compensation signal.

The second compensation stage uses signal traces S3 and S6, and offshoot traces OCN4 and OCN5 to create the desired second-stage compensation signal. A C45 capacitive coupling (e.g., pad capacitor) positioned between offshoot traces OCN4 and OCN5 (shunting signal traces S4 and S5) enables the OCN component of the second compensation stage. In particular, the desired coupling between wire-pair 4:5 and wire-pair 3:6 is achieved through capacitive couplings C34 and C56, and inductive couplings MOCN34 and MOCN56. Signal trace S3 and the offshoot trace OCN4, in combination with the shunt capacitance C45, interact capacitively to create capacitive coupling C34 and interact inductively to create mutually inductive coupling MOCN34. Signal trace S6 and the offshoot trace OCN5, in combination with the shunt capacitance C45, interact capacitively to create capacitive coupling C56 and interact inductively to create mutually inductive coupling MOCN56. Since this second compensation stage generally provides coupling between traces 3 and 4, and 5 and 6, the net resultant signal produced by this network would typically be considered a crosstalk signal. The net resultant coupling of the compensation network of FIG. 18 may provide additional NEXT bandwidth which may help to allow wire-pair combination 4:5-3:6 to meet potential standards for 40 GBASE-T and beyond.

Still other embodiments may combine compensation stages such that the first compensation stage omits direct signal trace-to-signal trace coupling (as described in the embodiment of FIG. 18) and the second compensation stage includes direct signal trace-to-signal trace coupling (as described in the embodiments of FIGS. 13, 15, 16, and 17).

Conversely, still other embodiments may combine compensation stages such that the first compensation stage includes direct signal trace-to-signal trace coupling (as described in the embodiments of FIGS. 13, 15, 16, and 17) and the second compensation stage omits direct signal trace-to-signal trace coupling (as described in the embodiment of FIG. 18).

Figure 19:
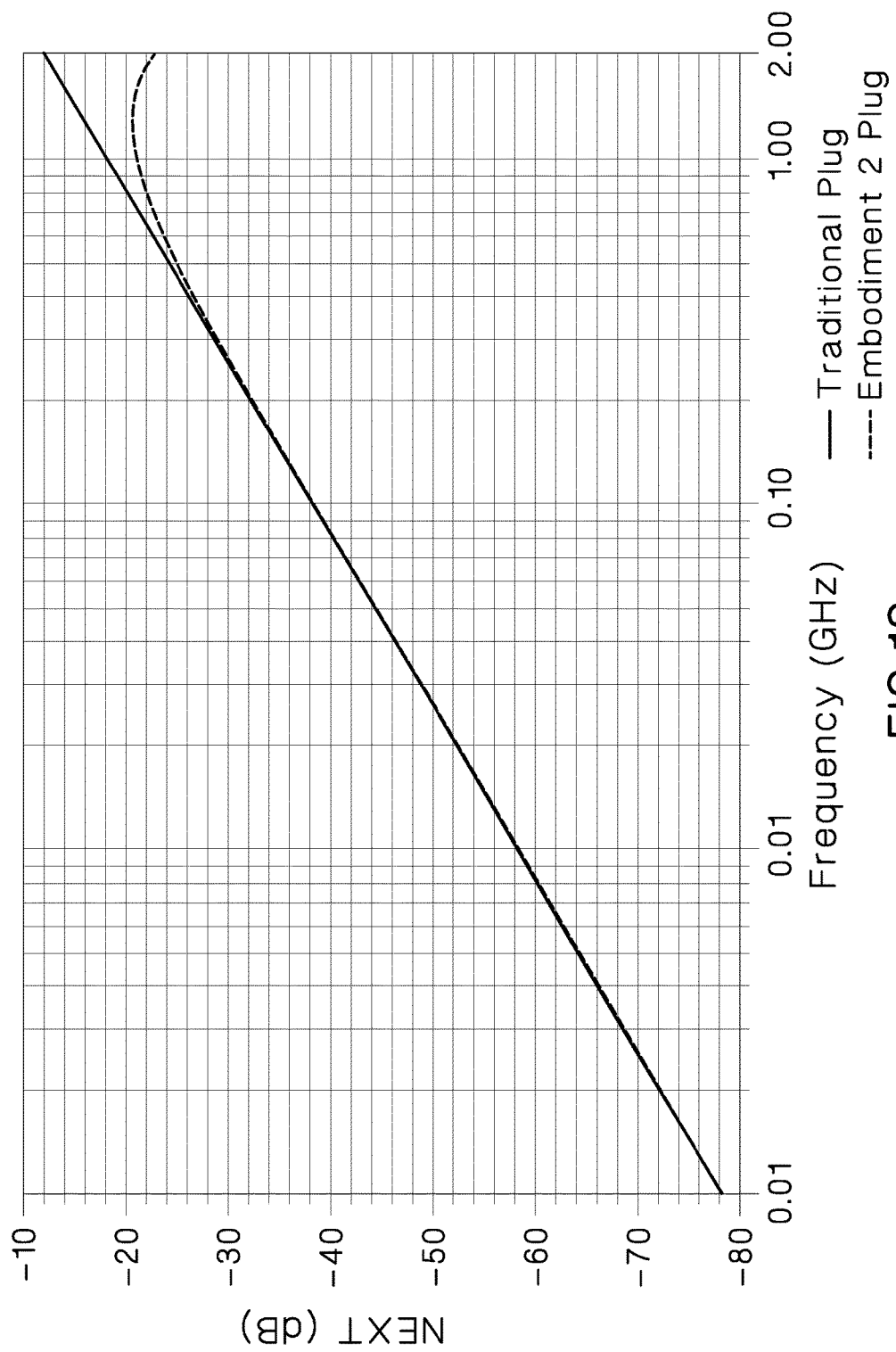
FIG. 19 illustrates the low plug NEXT for the 4:5-3:6 wire-pair combination according to an embodiment of the present invention.

An alternate embodiment of the present invention directed toward reducing NEXT up to and/or above 2 GHz while still maintaining backward compatibility with standards such as Category 6 and Category 6A involves implementing a novel crosstalk characteristic within the RJ45 plug. Instead of the plug crosstalk increasing at a generally linear rate of approximately 20 dB per decade across the usable bandwidth (as shown in FIG. 1), in one embodiment of the present invention the plug crosstalk is frequency dependent, and increases at a slower rate or decreases when the plug is subjected to operational frequencies above 500 MHz. By maintaining an approximately 20 dB per decade NEXT slope below 500 MHz, compatibility with Category 6A and other jacks can be maintained. The crosstalk response of a plug (represented by the line labeled "Embodiment 2 Plug") designed in accordance with one variation of the aforementioned embodiment shown in FIG. 19.

Figure 20:
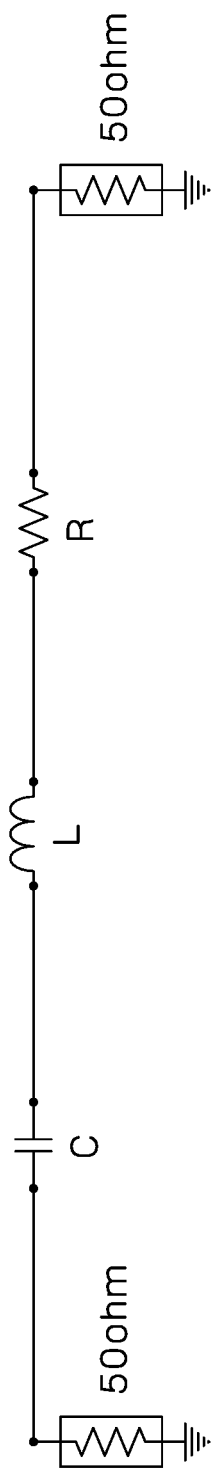
FIG. 20 illustrates schematic for a circuit used in an embodiment of the present invention.

One non-limiting example of realizing the desired frequency dependent crosstalk response of the currently described embodiment is to introduce an inductance (L) and a resistance (R) in series with a capacitance (C), as shown in the schematic representation of a circuit in FIG. 20, between certain conductors of a plug. The circuit shown in FIG. 20 may be referred to as series resonant circuit.

One should note that the overall crosstalk produced within a plug having one or more series resonant circuit(s) would be the combination of crosstalk coupling produced by the series resonant circuit(s) and the crosstalk coupling produced by the non-series resonant circuit elements (e.g., plug contacts). Thus, the desired behavior of slowing the increase or decreasing the overall crosstalk within the plug can be achieved by adjusting the amounts of crosstalk coupling provided by the series resonant circuit(s) and the non-series resonant circuit elements.

The impedance through this circuit is complex and frequency dependent, and can be derived through circuit analysis resulting in:

$$Z(j\omega) = R + Z_C + Z_L$$
$$= R + 1/j\omega C + j\omega L$$
$$= R + j(\omega L - 1/\omega C)$$

At low frequencies, the inductor's impedance (ZL) is low, and the capacitor's impedance (ZC) is high and dominates the impedance through the circuit. As frequency increases, ZC will decrease while ZL will increase. At a certain frequency ZL will be equal to ZC. This frequency is commonly referred to as the resonant frequency $\omega_r$. At this frequency, the complex portion of the impedance through the circuit ($\omega L - 1/\omega C$) will be zero, presenting a purely real impedance R through the circuit. Solving for $\omega$ in the equation below reveals the relationship between the inductance (L), capacitance (C), and the resonant frequency of the circuit ($\omega_r$).

$$\omega L - 1/\omega C = 0$$

$$\omega L = 1/\omega C$$

$$\omega_r = 1/\sqrt{(LC)}$$

The magnitude of $Z(j\omega)$ will be at its minimum at the resonant frequency, which will consequently result in a maximum amount of crosstalk coupling through the series resonant circuit. If the operating frequency is above $\omega_r$, the magnitude of $Z(j\omega)$ will increase as ZL continues to rise and dominate the impedance through the circuit. This will cause the crosstalk coupling through the series circuit to decrease.

Figure 21:
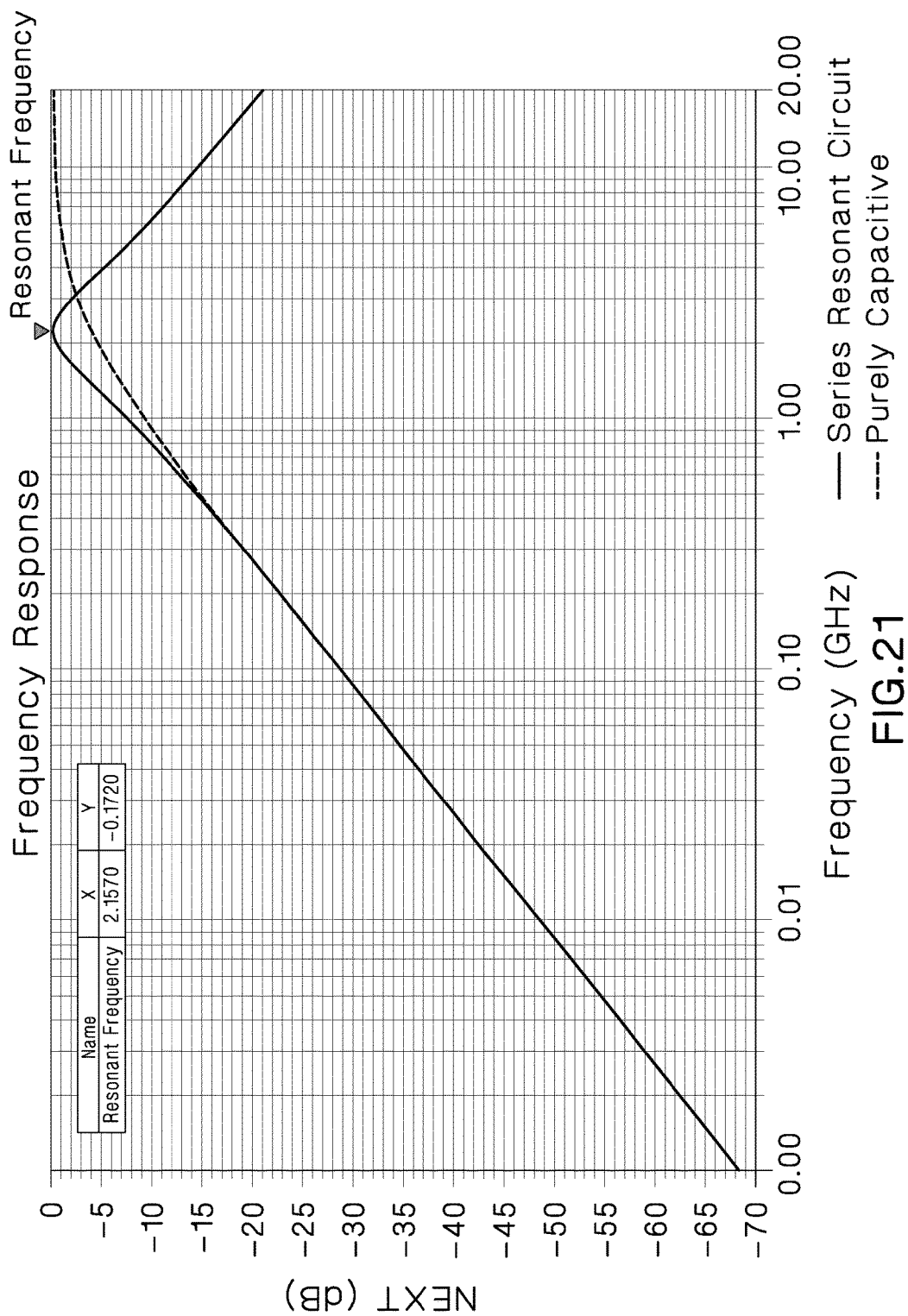
FIG. 21 illustrates the frequency response of the circuit of FIG. 10 in accordance with an embodiment of the present invention.
Figure 22:
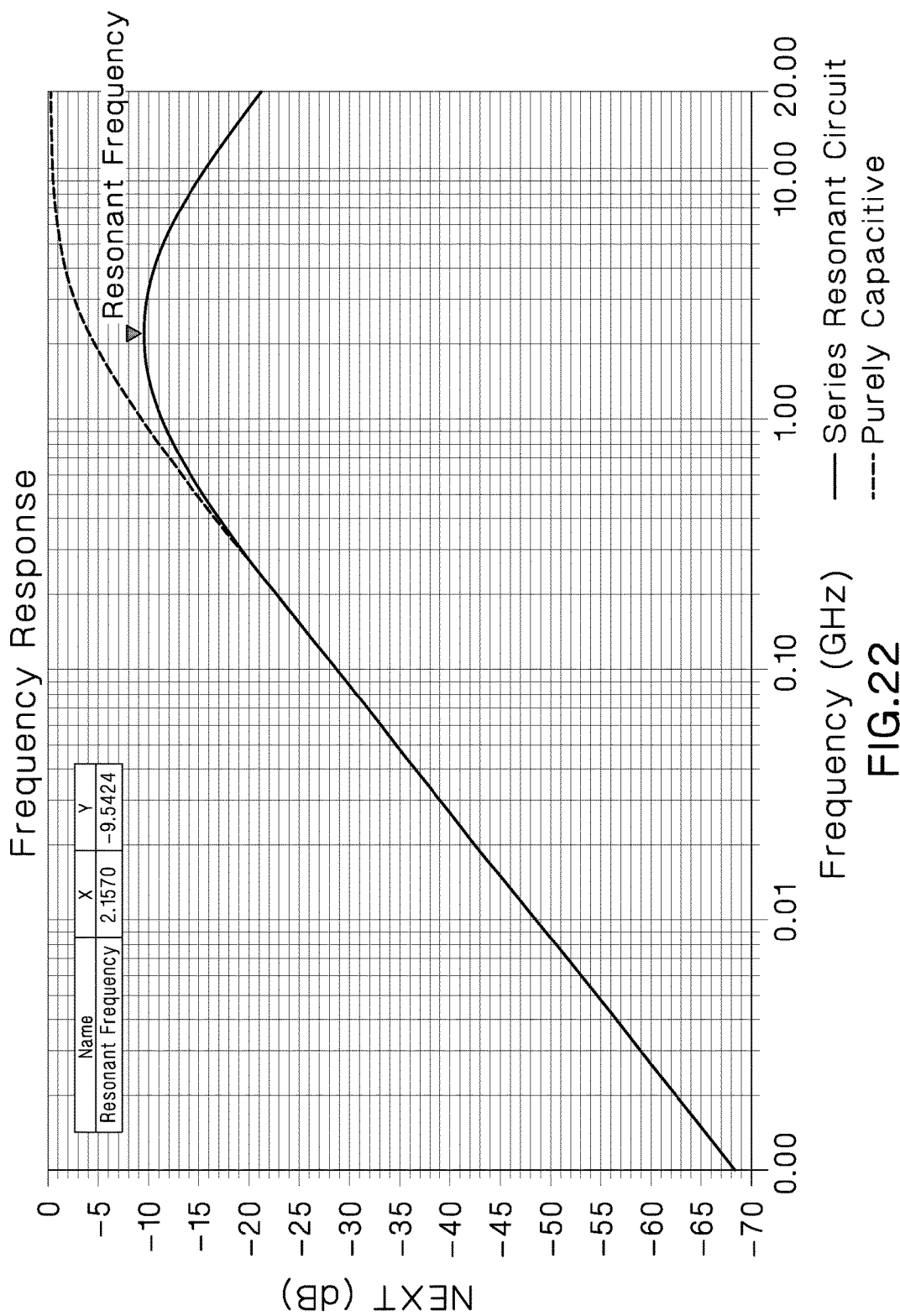
FIG. 22 illustrates the frequency response of the circuit of FIG. 10 in accordance with another embodiment of the present invention.

The frequency response of a series resonant circuit having exemplary values L=9 nH, C=0.605 pF, and R=2.0Ω is illustrated in FIG. 21. The frequency response of a purely capacitive coupling circuit with C=0.605 pF is also shown for reference. The response of the series resonant circuit rises above the purely capacitive response around 500 MHz and peaks at $\omega_r$=2.157 GHz=$1/\sqrt{(LC)}$ which would not satisfy the goal of decreasing the crosstalk above 500 MHz. To adjust and lower the peak level of the response of the resonant circuit at $\omega_r$, the value of the resistor (R) can be increased. For example, to achieve the frequency response shown in FIG. 22, a resistor value of 200Ω can be used. Such a configuration may achieve the desired result of lowering the response of the resonant circuit below the response of a purely capacitive circuit for frequencies above 500 MHz.

Figure 23:
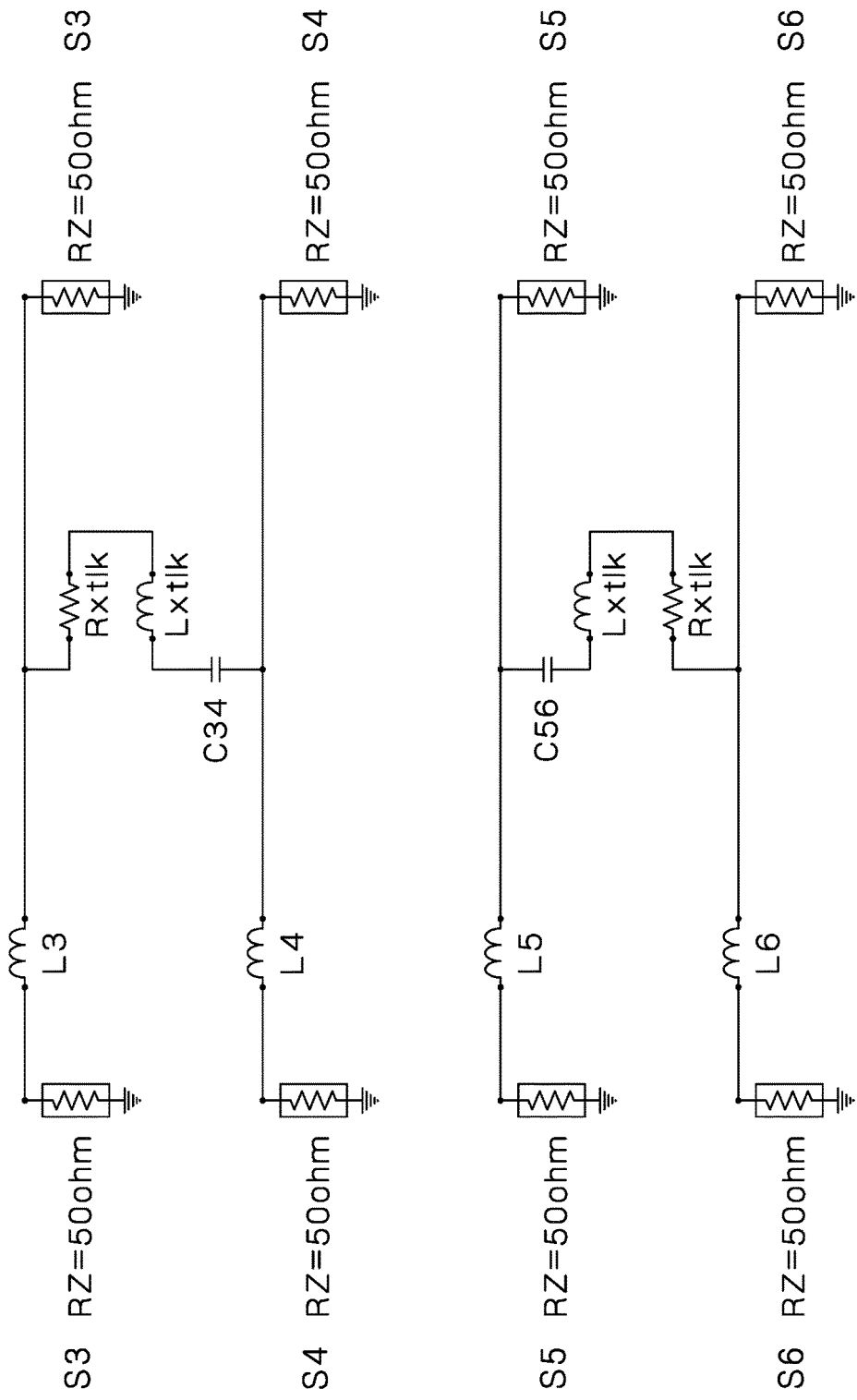
FIG. 23 illustrates a schematic for the 4:5-3:6 wire-pair combination within a plug designed according to an embodiment of the present invention.

An example of using resonant circuits on the 4:5-3:6 wire-pair combination in an RJ45 plug to achieve a particular frequency dependent response is illustrated in the partial schematic representation of a plug shown in FIG. 23. In this schematic, two series resonant circuits are positioned between signal traces S3 and S4, and S6 and S5, respectively. Each series resonant circuit is comprised of an inductance (Lxtalk=9 nH) and a resistance (Rxtalk=200Ω) connected in series with a capacitive coupling C34/C56, respectively, with each capacitive coupling being approximately 0.605 pF.

Figure 24:
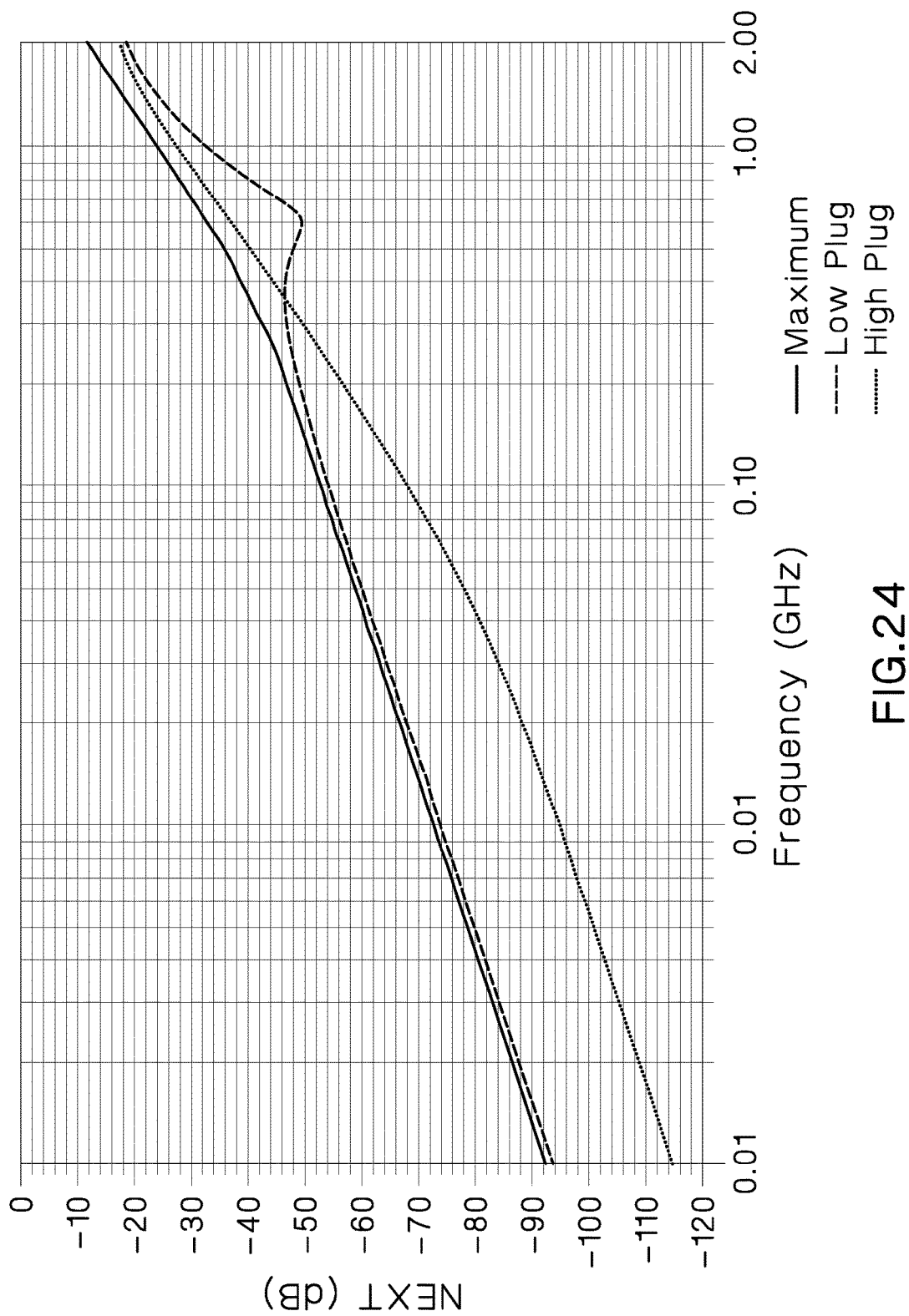
FIG. 24 illustrates the frequency response of the plug of FIG. 14 mated to a jack using a traditional two-stage compensation technique with respect to the 4:5-3:6 wire-pair combination.

The frequency response of a combination of a plug having the circuit of FIG. 23 mated to a jack having a traditional two-stage compensation network is shown in FIG. 24. As can be seen in these results, implementing the series resonant circuits within the plug to manage the crosstalk produced therein over a frequency range produces the desired result of attaining sufficiently low overall NEXT in the mated plug/jack combination up to, and potentially above, 2 GHz. While these embodiments for improved NEXT performance beyond 500 MHz have been demonstrated for wire-pair combination 4:5-3:6, the same techniques can also be implemented on other wire-pair combinations.

Figure 25:
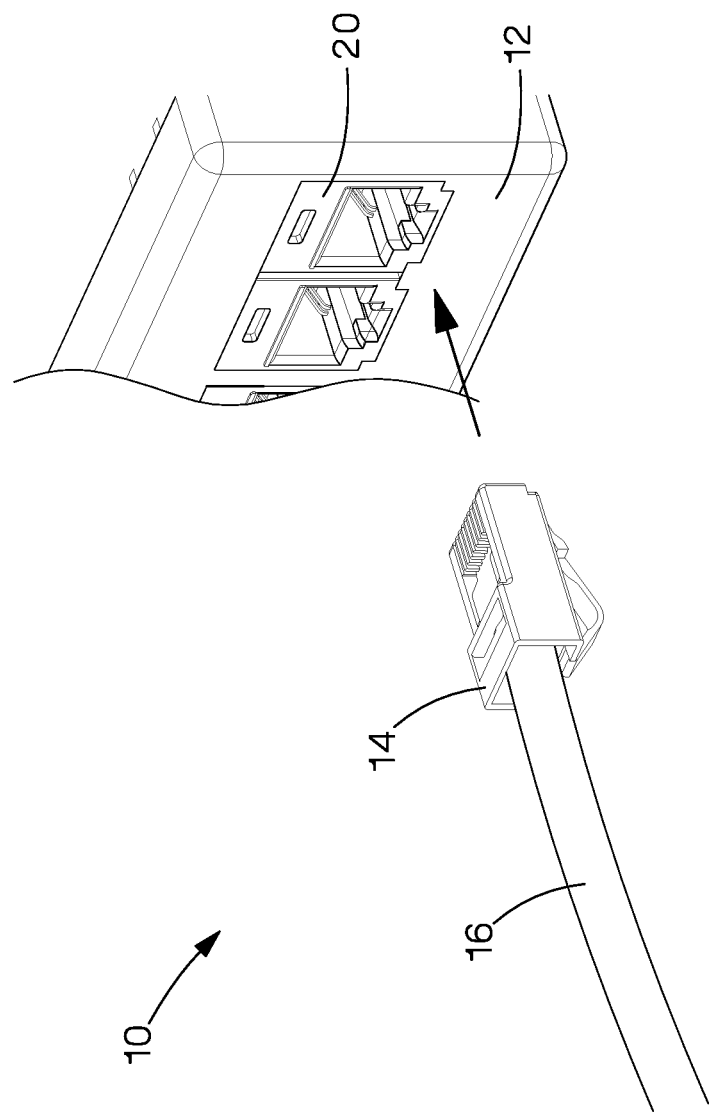
FIG. 25 illustrates a perspective view of a communication system according to an embodiment of the present invention.

FIG. 25 illustrates a communication system 10, according to the present invention, having a patch panel 12 with at least one jack 20 mounted therein and connected to a data cable (not shown). A plug 14, connected to a cable 16, can mate with the jack(s) 20 which allows data to flow in both directions through these components. Although the communication system 10 is illustrated in FIG. 25 as having a communication equipment such as a patch panel, alternative embodiments can include other active or passive communication equipment. Examples of passive equipment can be, but are not limited to, modular patch panels, punch-down patch panels, coupler patch panels, wall jacks, etc. Examples of active equipment can be, but are not limited to, Ethernet switches, routers, servers, physical layer management systems, and power-over-Ethernet equipment as can be found in data centers and or telecommunications rooms; security devices (cameras and other sensors, etc.) and door access equipment; and telephones, computers, fax machines, printers, and other peripherals as can be found in workstation areas. Communication system 10 can further include cabinets, racks, cable management and overhead routing systems, and other such equipment.

Figure 26:
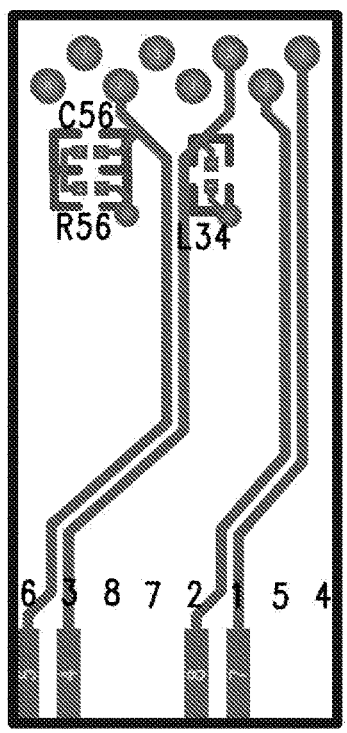
FIG. 26 illustrates a top view of a first layer of a plug PCB according to an embodiment of the present invention.
Figure 27:
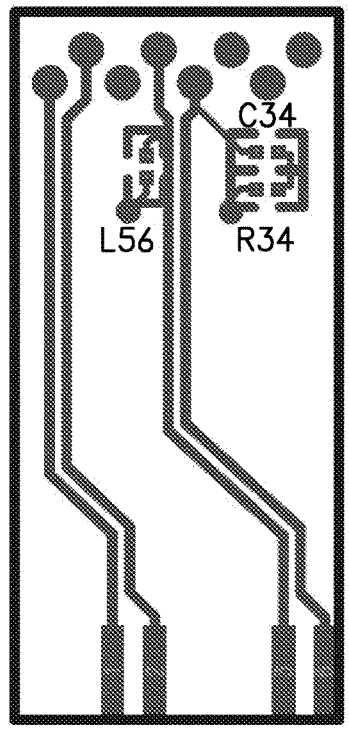
FIG. 27 illustrates a top view of a second layer of the plug PCB of FIG. 26.
Figure 28:
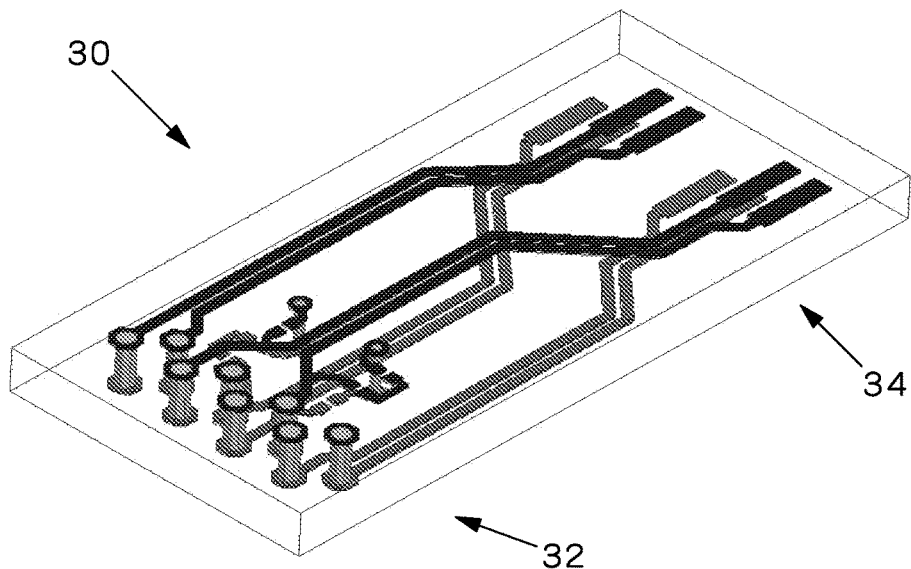
FIG. 28 illustrates a perspective view of the plug PCB of FIGS. 26 and 27.

The embodiments of FIG. 23 can be implemented in a communication connector such as plug 14, or other connectors, and plug 14 can be an RJ45 plug as shown, for example. In at least one embodiment, the circuits of FIG. 23 can be implemented on a printed circuit board (PCB) within the plug. In the embodiment of FIG. 23 such a plug may also include plug contacts connected to the PCB where the plug contacts have reduced crosstalk when compared to typical CAT6A plugs. The plug contacts of the present invention may have reduced crosstalk by reducing the size of the contacts, or otherwise reducing the plate area of the contacts. For example, plug 14 can be implemented using at least some of the techniques described in U.S. Patent Application Publication No. 2012/0100744 (Bolouri-Saransar et al.), entitled "Communication Plug with Improved Crosstalk," filed on Oct. 21, 2010, incorporated herein by reference in its entirety. PCB 30 (FIGS. 26-28) can be used within the mechanical structure described in the Bolouri-Saransar et al. '744 publication where R, L and C components can be located as shown particularly in FIGS. 26 and 27, plug contacts can be placed at vias 32, and cable conductors can be soldered at pads 34; or alternatively, PCB 30 artwork can be modified to accommodate insulation displacement contacts instead of pads 34 similar to that shown in the Bolouri-Saransar et al. '744 publication. Other RJ45 plug implementations are within the scope of the present invention, as are other plug types, such as ARJ45, or other.

Note that while this invention has been described in terms of several embodiments, these embodiments are non-limiting (regardless of whether they have been labeled as exemplary or not), and there are alterations, permutations, and equivalents, which fall within the scope of this invention. Additionally, the described embodiments should not be interpreted as mutually exclusive, and should instead be understood as potentially combinable if such combinations are permissive. Furthermore, it should be understood that any polar or time-domain plots shown herein are not intended to be limiting of the present invention. Instead, these plots are to be understood as exemplary, illustrating the generalized representation of the performance of the present invention according to only some of the embodiments. It should also be noted that there are many alternative ways of implementing the methods and apparatuses of the present invention. It is therefore intended that claims that may follow be interpreted as including all such alterations, permutations, and equivalents as fall within the true spirit and scope of the present invention.

We claim:

1. A communication jack comprising:
   a plurality of signal pairs including at least a first signal pair and a second signal pair;
   a first compensation stage between said first signal pair and said second signal pair; and
   a second compensation stage between said first signal pair and said second signal pair, said second compensation stage being time delayed with respect to said first compensation stage,
   at least one of said first compensation stage and said second compensation stage including a compensation network, said compensation network including a first capacitive coupling between said first signal pair and said second signal pair producing a first capacitive signal, and a first mutual inductive coupling between said first signal pair and said second signal pair producing a first mutual inductive signal, said first mutual inductive signal occurring at approximately same time as and being phase-shifted relative to said first capacitive signal.

2. The communication jack of claim 1, wherein said communication jack is an RJ45 jack.

3. The communication jack of claim 1, wherein said first mutual inductive signal is phase-shifted approximately 90 degrees relative to said first capacitive signal.

4. The communication jack of claim 1, wherein said compensation network further includes a shunt capacitive coupling positioned between conductors of one of said first signal pair and said second signal pair.

5. The communication jack of claim 4, wherein said shunt capacitive coupling enables said first mutual inductive signal to be phase-shifted relative to said first capacitive signal.

6. The communication jack of claim 4, wherein said shunt capacitive coupling enables said first mutual inductive coupling.

7. The communication jack of claim 1, wherein said communication jack is configured to mate with a corresponding communication plug producing crosstalk of a first polarity, and wherein at least one of said first compensation stage and said second compensation stage produces a crosstalk signal with a polarity that is same as said first polarity.

8. The communication jack of claim 7, wherein at least one of said first compensation stage and said second compensation stage produces a crosstalk signal with a polarity that is opposite of said first polarity.

9. The communication jack of claim 1, wherein said at least one of said first compensation stage and said second compensation stage that includes said compensation network further includes a second capacitive coupling between said first signal pair and said second signal pair producing a second capacitive signal and a second mutual inductive coupling between said first signal pair and said second signal pair producing a second mutual inductive signal.

10. The communication jack of claim 9, wherein said second capacitive signal is in phase with said second mutual inductive signal.

11. The communication jack of claim 9, wherein said second capacitive coupling is independent of said first capacitive coupling.

12. The communication jack of claim 9, wherein said second mutual inductive coupling is independent of said first mutual inductive coupling.

* * * * *